US009553353B2

(12) United States Patent
Sovero et al.

(10) Patent No.: US 9,553,353 B2
(45) Date of Patent: Jan. 24, 2017

(54) REDIRECTION OF ELECTROMAGNETIC SIGNALS USING SUBSTRATE STRUCTURES

(71) Applicant: Keyssa, Inc., Mountain View, CA (US)

(72) Inventors: Emilio Sovero, Thousand Oaks, CA (US); Gary D. McCormack, Tigard, OR (US)

(73) Assignee: Keyssa, Inc., Campbell, CA (US)

( * ) Notice: Subject to any disclaimer, the term of this patent is extended or adjusted under 35 U.S.C. 154(b) by 370 days.

(21) Appl. No.: 13/852,510

(22) Filed: Mar. 28, 2013

(65) Prior Publication Data

US 2013/0257670 A1    Oct. 3, 2013

Related U.S. Application Data

(60) Provisional application No. 61/616,970, filed on Mar. 28, 2012.

(51) Int. Cl.
*H01Q 1/24* (2006.01)
*H01P 3/00* (2006.01)
(Continued)

(52) U.S. Cl.
CPC .............. *H01Q 1/24* (2013.01); *H01P 3/006* (2013.01); *H01P 3/121* (2013.01); *H01Q 1/48* (2013.01);
(Continued)

(58) Field of Classification Search
CPC ........... H05K 2201/09845; H05K 2201/09618; H05K 2201/0919
See application file for complete search history.

(56) References Cited

U.S. PATENT DOCUMENTS

| 3,796,831 A | 3/1974 | Bauer |
| 4,485,312 A | 11/1984 | Kusakabe et al. |

(Continued)

FOREIGN PATENT DOCUMENTS

| CN | 1386032 A | 12/2002 |
| CN | 101227794 A | 7/2008 |

(Continued)

OTHER PUBLICATIONS

European Patent Office, "International Search Report" in connection with related PCT Patent Application No. PCT/US2013/034352, dated Apr. 10, 2014, 4 pages.

(Continued)

*Primary Examiner* — Hoang V Nguyen
*Assistant Examiner* — Michael Bouizza
(74) *Attorney, Agent, or Firm* — Fenwick & West LLP

(57) ABSTRACT

A system for transmitting or receiving signals may include a dielectric substrate having a major face, a communication circuit, and an electromagnetic-energy directing assembly. The circuit may include a transducer configured to convert between RF electrical and RF electromagnetic signals and supported in a position spaced from the major face of the substrate operatively coupled to the transducer. The directing assembly may be supported by the substrate in spaced relationship from the transducer and configured to direct EM energy in a region including the transducer and along a line extending away from the transducer and transverse to a plane of the major face.

11 Claims, 13 Drawing Sheets

(51) Int. Cl.
*H05K 1/02* (2006.01)
*H01Q 7/00* (2006.01)
*H01P 3/12* (2006.01)
*H01Q 1/48* (2006.01)

(52) U.S. Cl.
CPC .............. *H01Q 7/00* (2013.01); *H05K 1/0218* (2013.01); *H05K 1/0274* (2013.01); *H01L 2224/32225* (2013.01); *H01L 2224/48091* (2013.01); *H01L 2224/48227* (2013.01); *H01L 2224/73265* (2013.01); *H01L 2924/15311* (2013.01); *H05K 2201/0191* (2013.01); *H05K 2201/0919* (2013.01); *H05K 2201/09618* (2013.01); *H05K 2201/09845* (2013.01); *H05K 2201/2036* (2013.01)

(56) References Cited

U.S. PATENT DOCUMENTS

| | | |
|---|---|---|
| 4,497,068 A | 1/1985 | Fischer |
| 4,694,504 A | 9/1987 | Porter et al. |
| 5,543,808 A | 8/1996 | Feigenbaum et al. |
| 5,621,913 A | 4/1997 | Tuttle et al. |
| 5,754,948 A | 5/1998 | Metze |
| 5,773,878 A | 6/1998 | Lim et al. |
| 5,861,782 A | 1/1999 | Saitoh |
| 5,956,626 A | 9/1999 | Kaschke et al. |
| 6,351,237 B1 | 2/2002 | Martek et al. |
| 6,490,443 B1 | 12/2002 | Freeny, Jr. |
| 6,492,973 B1 | 12/2002 | Kuroki et al. |
| 6,534,784 B2 | 3/2003 | Eliasson et al. |
| 6,542,720 B1 | 4/2003 | Tandy |
| 6,590,544 B1 | 7/2003 | Filipovic |
| 6,607,136 B1 | 8/2003 | Atsmon et al. |
| 6,718,163 B2 | 4/2004 | Tandy |
| 6,915,529 B1 | 7/2005 | Suematsu et al. |
| 6,967,347 B2 | 11/2005 | Estes et al. |
| 7,107,019 B2 | 9/2006 | Tandy |
| 7,213,766 B2 | 5/2007 | Ryan et al. |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,599,427 B2 | 10/2009 | Bik |
| 7,612,630 B2 | 11/2009 | Miller |
| 7,617,342 B2 | 11/2009 | Rofougaran |
| 7,645,143 B2 | 1/2010 | Rohrbach et al. |
| 7,656,205 B2 | 2/2010 | Chen et al. |
| 7,664,461 B2 | 2/2010 | Rofougaran et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,820,990 B2 | 10/2010 | Schroeder et al. |
| 7,889,022 B2 | 2/2011 | Miller |
| 7,907,924 B2 | 3/2011 | Kawasaki |
| 7,929,474 B2 | 4/2011 | Pettus et al. |
| 8,014,416 B2 | 9/2011 | Ho et al. |
| 8,036,629 B2 | 10/2011 | Tandy |
| 8,041,227 B2 | 10/2011 | Holcombe et al. |
| 8,063,769 B2 | 11/2011 | Rofougaran |
| 8,081,699 B2 | 12/2011 | Siwiak et al. |
| 8,087,939 B2 | 1/2012 | Rohrbach et al. |
| 8,121,542 B2 | 2/2012 | Zack et al. |
| 8,183,935 B2 | 5/2012 | Milano et al. |
| 8,244,179 B2 | 8/2012 | Dua |
| 8,279,611 B2 | 10/2012 | Wong et al. |
| 8,339,258 B2 | 12/2012 | Rofougaran |
| 2002/0008665 A1 | 1/2002 | Takenoshita |
| 2002/0118083 A1 | 8/2002 | Pergande |
| 2003/0137371 A1 | 7/2003 | Saitoh et al. |
| 2004/0214621 A1 | 10/2004 | Ponce De Leon et al. |
| 2005/0098348 A1* | 5/2005 | Okumichi ......... H01L 23/49827 174/262 |
| 2005/0140436 A1 | 6/2005 | Ichitsubo et al. |
| 2006/0038168 A1 | 2/2006 | Estes et al. |
| 2006/0159158 A1 | 7/2006 | Moore et al. |
| 2007/0024504 A1 | 2/2007 | Matsunaga |
| 2007/0063056 A1 | 3/2007 | Gaucher et al. |
| 2007/0229270 A1 | 10/2007 | Rofougaran |
| 2007/0278632 A1 | 12/2007 | Zhao et al. |
| 2008/0089667 A1 | 4/2008 | Grady et al. |
| 2008/0112101 A1 | 5/2008 | McElwee et al. |
| 2008/0150799 A1 | 6/2008 | Hemmi et al. |
| 2008/0150821 A1 | 6/2008 | Koch et al. |
| 2008/0159243 A1 | 7/2008 | Rofougaran |
| 2008/0192726 A1 | 8/2008 | Mahesh et al. |
| 2008/0195788 A1 | 8/2008 | Tamir et al. |
| 2008/0290959 A1 | 11/2008 | Ali et al. |
| 2008/0293446 A1 | 11/2008 | Rofougaran |
| 2009/0006677 A1 | 1/2009 | Rofougaran |
| 2009/0009337 A1 | 1/2009 | Rofougaran |
| 2009/0037628 A1 | 2/2009 | Rofougaran |
| 2009/0075688 A1 | 3/2009 | Rofougaran |
| 2009/0094506 A1 | 4/2009 | Lakkis |
| 2009/0175323 A1 | 7/2009 | Chung |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0280765 A1 | 11/2009 | Rofougaran et al. |
| 2010/0127804 A1 | 5/2010 | Vouloumanos |
| 2010/0159829 A1 | 6/2010 | McCormack |
| 2010/0202499 A1 | 8/2010 | Lee et al. |
| 2010/0231452 A1 | 9/2010 | Babakhani et al. |
| 2010/0277394 A1 | 11/2010 | Haustein et al. |
| 2010/0283700 A1 | 11/2010 | Rajanish et al. |
| 2010/0285634 A1 | 11/2010 | Rofougaran |
| 2010/0297954 A1 | 11/2010 | Rofougaran et al. |
| 2011/0047588 A1 | 2/2011 | Takeuchi et al. |
| 2011/0084398 A1 | 4/2011 | Pilard et al. |
| 2011/0181484 A1 | 7/2011 | Pettus et al. |
| 2011/0207425 A1 | 8/2011 | Juntunen et al. |
| 2011/0285606 A1 | 11/2011 | De Graauw et al. |
| 2011/0286703 A1 | 11/2011 | Kishima et al. |
| 2011/0311231 A1 | 12/2011 | Ridgway et al. |
| 2012/0013499 A1 | 1/2012 | Hayata |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0083137 A1 | 4/2012 | Rohrbach et al. |
| 2012/0263244 A1 | 10/2012 | Kyles et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |

FOREIGN PATENT DOCUMENTS

| | | |
|---|---|---|
| CN | 102150323 A | 8/2011 |
| EP | 0 515 187 A2 | 11/1992 |
| EP | 0789421 A2 | 8/1997 |
| EP | 0884799 A2 | 12/1998 |
| EP | 0896380 A2 | 2/1999 |
| EP | 0996189 A2 | 4/2000 |
| EP | 1041666 A1 | 10/2000 |
| EP | 1 298 809 A2 | 4/2003 |
| EP | 2 309 608 A1 | 4/2011 |
| EP | 2328226 A1 | 6/2011 |
| EP | 2 360 923 A1 | 8/2011 |
| GB | 2217114 A | 10/1989 |
| JP | 2001326506 A | 11/2001 |

(56) References Cited

FOREIGN PATENT DOCUMENTS

| | | |
|---|---|---|
| JP | 2002261514 A | 9/2002 |
| JP | 2002265729 A | 9/2002 |
| JP | 2008252566 A | 10/2008 |
| WO | 2011/114737 A1 | 9/2011 |
| WO | 2011/114738 A1 | 9/2011 |
| WO | 2012/129426 A3 | 9/2012 |
| WO | 2012/155135 A3 | 11/2012 |
| WO | 2012/166922 A1 | 12/2012 |
| WO | 2012/174350 A1 | 12/2012 |
| WO | 2013/006641 A3 | 1/2013 |
| WO | 2013/040396 A1 | 3/2013 |
| WO | 2013/059801 A1 | 4/2013 |
| WO | 2013/059802 A1 | 4/2013 |
| WO | 2013/090625 A1 | 6/2013 |

OTHER PUBLICATIONS

European Patent Office, "Written Opinion of the International Searching Authority" in connection with related PCT Patent Application No. PCT/US2013/034352, dated Apr. 10, 2014, 6 pages.

Eric A. Juntunen, "60 GHz CMOS Pico-Joule/Bit Oook Receiver Design for Multi-Gigabit Per Second Wireless Communications" thesis paper, Aug. 2008, 52 pages.

European Patent Office, "International Search Report" in connection with related Application Serial No. PCT/US2012/040214, dated Aug. 21, 2012, 3 pages.

European Patent Office, "Written Opinion of the International Searching Authority" in connection with related Application Serial No. PCT/US2012/040214, dated Aug. 21, 2012, 8 pages.

European Patent Office, "International Search Report" in connection with related Application Serial No. PCT/US2012/042616 dated Oct. 1, 2012, 4 pages.

European Patent Office, "Written Opinion of the International Searching Authority" in connection with related Application Serial No. PCT/US2012/042616 dated Oct. 1, 2012, 10 pages.

European Patent Office, "International Search Report" in connection with related Application No. PCT/US2012/030166, dated Oct. 31, 2010, 6 pages.

European Patent Office, "Written Opinion of the International Searching Authority" in connection with related Application No. PCT/US2012/030166, dated Oct. 31, 2010, 9 pages.

European Patent Office, "International Search Report" in connection with related Application No. PCT/US2012/055488, dated Dec. 13, 2012, 4 pages.

European Patent Office, "Written Opinion of the International Searching Authority" in connection with related Application No. PCT/US2012/055488, dated Dec. 13, 2012, 8 pages.

European Patent Office, "International Search Report" in connection with related Application No. PCT/US2012/045444, dated Jan. 21, 2013, 7 pages.

European Patent Office, "Written Opinion of the International Searching Authority" in connection with related Application No. PCT/US2012/045444, dated Jan. 21, 2013, 9 pages.

European Patent Office, "International Search Report" in connection with related Application No. PCT/US2012/037795, dated Jan. 21, 2013, 7 pages.

European Patent Office, "Written Opinion of the International Searching Authority" in connection with related Application No. PCT/US2012/037795, dated Jan. 21, 2013, 12 pages.

European Patent Office, "International Search Report" in connection with related Application No. PCT/US2012/061345, dated Jan. 24, 2013, 4 pages.

European Patent Office, "Written Opinion of the International Searching Authority" in connection with related Application No. PCT/US2012/061345, dated Jan. 24, 2013, 7 pages.

European Patent Office, "International Search Report" in connection with related Application No. PCT/US2012/061346, dated Jan. 24, 2013, 5 pages.

European Patent Office, "Witten Opinion of the International Searching Authority" in connection with related Application No. PCT/US2012/061346, dated Jan. 24, 2013, 9 pages.

European Patent Office, "International Search Report" in connection with related Application No. PCT/US2012/069576, dated May 2, 2013, 3 pages.

European Patent Office, "Written Opinion of the International Searching Authority" in connection with related Application No. PCT/US2012/069576, dated May 2, 2013, 13 pages.

Office of Engineering and Technology Federal Communications Commission, "Understanding the FCC Regulations for Low-Power, Non-Licensed Transmitters", OET Bulletin No. 63, Oct. 1993, 34 pages.

Vahle Electrification Systems, "CPS Contactless Power System", Catalog No. 9d/E, 2004, 12 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

U.S. Patent and Trademark Office, "International Search Report" in connection with related PCT Patent App. No. PCT/US2013/027835, dated May 3, 2013, 4 pages.

U.S. Patent and Trademark Office, "Written Opinion of the International Searching Authority" in connection with related PCT Patent App. No. PCT/US2013/027835, dated May 3, 2013, 8 pages.

European Patent Office, "International Search Report" in connection with related PCT Patent App. No. PCT/US2013/029469, dated Jun. 6, 2013, 5 pages.

European Patent Office, "Written Opinion of the International Searching Authority" in connection with related PCT Patent App. No. PCT/US2013/029469, dated Jun. 6, 2013, 5 pages.

European Patent Office, "International Search Report" in connection with related PCT Patent App. No. PCT/US2013/023665, dated Jun. 20, 2013, 5 pages.

European Patent Office, "Written Opinion of the International Searching Authority" in connection with related PCT Patent App. No. PCT/US2013/023665, dated Jun. 20, 2013, 10 pages.

Chinese First Office Action, Chinese Application No. 201380025055.1, Oct. 8, 2016, 8 pages (with concise explanation of relevance).

* cited by examiner

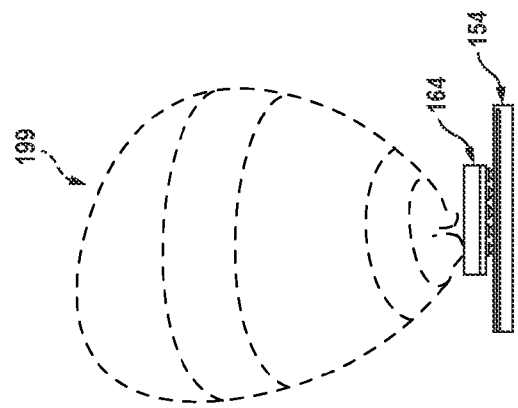
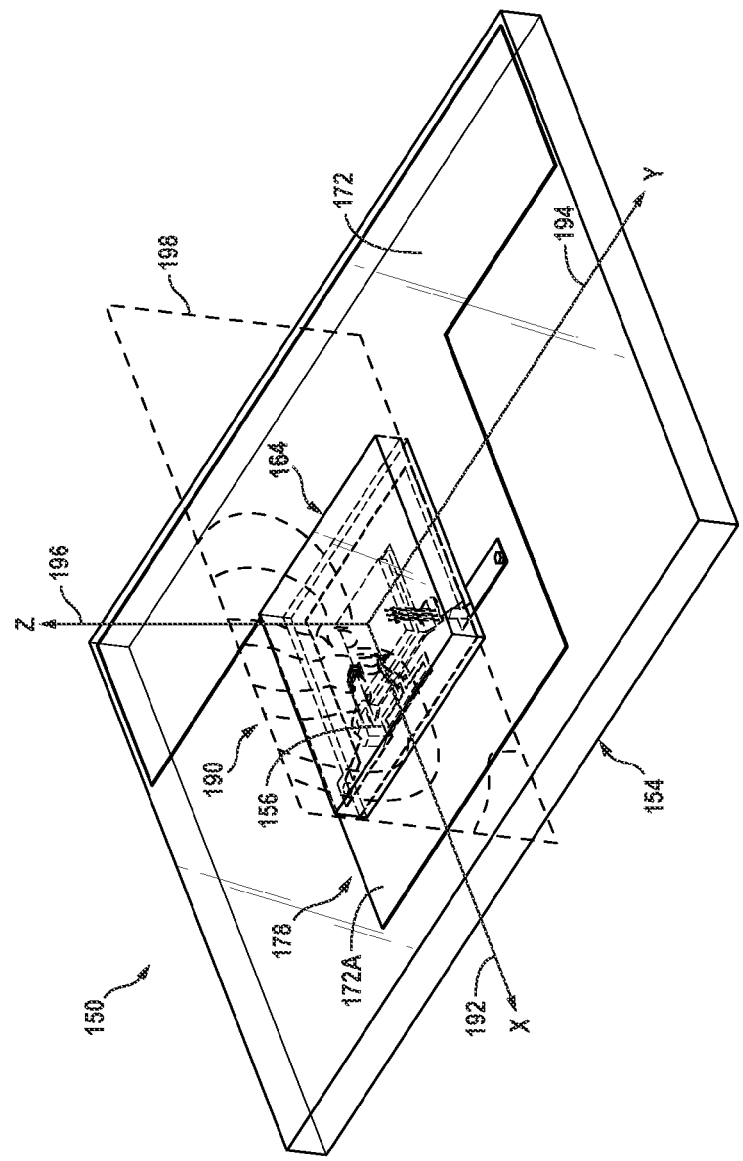

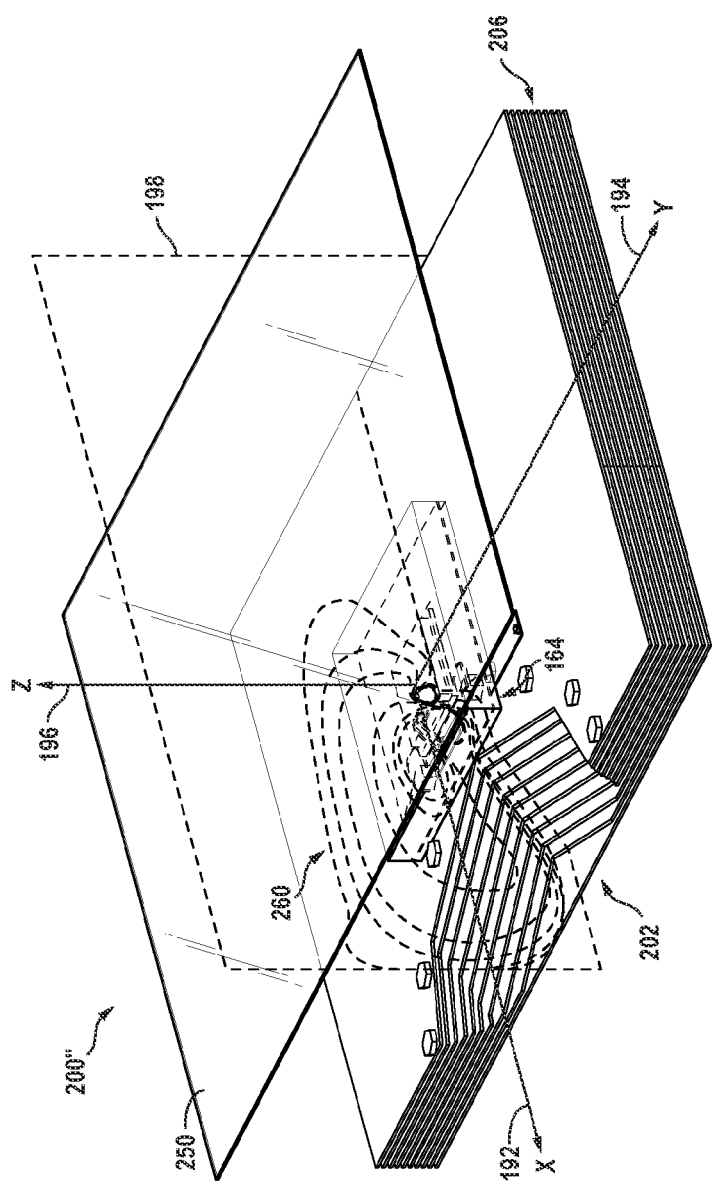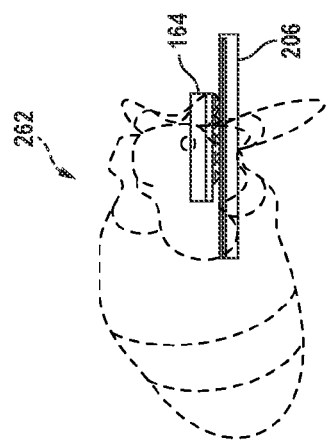

REDIRECTION OF ELECTROMAGNETIC SIGNALS USING SUBSTRATE STRUCTURES

RELATED APPLICATION

This application claims the benefit of U.S. Provisional Patent Application No. 61/616,970 filed Mar. 28, 2012, which application is incorporated herein by reference for all purposes.

FIELD OF THE INVENTION

This disclosure relates to systems, apparatus, and methods related to shaping and directing of electromagnetic signals, specifically EHF radiation.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and along which various signals are routed to and from the ICs. In electronic systems with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Interconnecting boards and circuits by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

These characteristics of conventional connectors can lead to degradation of signal integrity and instability of electronic systems needing to transfer data at very high rates, which in turn limits the utility of such products.

SUMMARY

In a first example, a system for transmitting or receiving signals may include a dielectric substrate having a major face, a communication circuit, and an electromagnetic-energy directing assembly. The communication circuit may include a transducer configured to convert between radio-frequency (RF) electrical signals and RF electromagnetic (EM) signals, the transducer being supported in a position spaced from the major face of the dielectric substrate operatively coupled to the transducer. The communication circuit may contain at least one of a transmitter circuit that transforms a baseband signal into a RF electrical signal and conducts the RF electrical signal to the transducer for transmission as an EM signal and a receiver circuit that receives from the transducer a RF electrical signal received as an EM signal by the transducer and transforms the RF electrical signal into a baseband signal. A directing assembly may be supported by the dielectric substrate in spaced relationship from the transducer and configured to direct EM energy in a region including the transducer and along a line extending away from the transducer and transverse to a plane of the major face of the dielectric substrate.

In another example, a device for directing extremely high frequency (EHF) EM radiation may include a dielectric substrate having a major face configured to support an EM transducer in a transducer position and an electromagnetic-energy directing assembly. The directing assembly may be supported by the dielectric substrate relative to the transducer position and configured to direct EM energy along a line extending away from the transducer position and transverse to a plane of the major face of the dielectric substrate. The directing assembly may include a plurality of spaced-apart embedded conductive layers disposed in the dielectric substrate. The plurality of embedded conductive layers each may have a major surface with a first perimeter. The first perimeters may include perimeter portions proximate the transducer that are offset relative to each other as viewed from the transducer in a manner exposing each perimeter portion to the transducer.

In another example, a dielectric substrate assembly may include a first conductive layer; a second conductive layer parallel to, spaced from, and opposite the first conductive layer; a dielectric layer extending between the first and second conductive layers; and a plurality of electrically conductive components connected to and extending between the first and second conductive layers. The conductive components may be spaced apart and distributed in the dielectric layer in a configuration defining, in combination with the first and second conductive layers, a waveguide extending through the dielectric layer.

In a further example, a waveguide for conducting an electromagnetic EHF signal, may include an elongate length of a dielectric material and a conductive layer covering at least a portion of the length of the dielectric material. The dielectric material may have a rectangular cross section transverse to the elongate length of the dielectric material. The elongate length of dielectric material may have a first lateral side and a second lateral side opposed to the first lateral side, and a first major side and a second major side opposed to the first major side. The elongate length of dielectric material may have a width corresponding to a distance between the first lateral side and the second lateral side, and a height corresponding to a distance between the first major side and the second major side.

Advantages of such systems and devices will be more readily understood after considering the drawings and the detailed description.

BRIEF DESCRIPTION OF THE DRAWINGS

FIG. 6B is a diagram similar to FIG. 6A that includes an indication of a representative associated electromagnetic (EM) radiation pattern.

FIG. 6C is an illustration of an exemplary representation of antenna gain for the system of FIG. 6A.

FIG. 10B is a diagram similar to FIG. 10A that includes an indication of a representative associated EM radiation pattern.

FIG. 10C is an illustration of an exemplary representation of antenna gain for the system of FIG. 10A.

DETAILED DESCRIPTION

Figure 1:
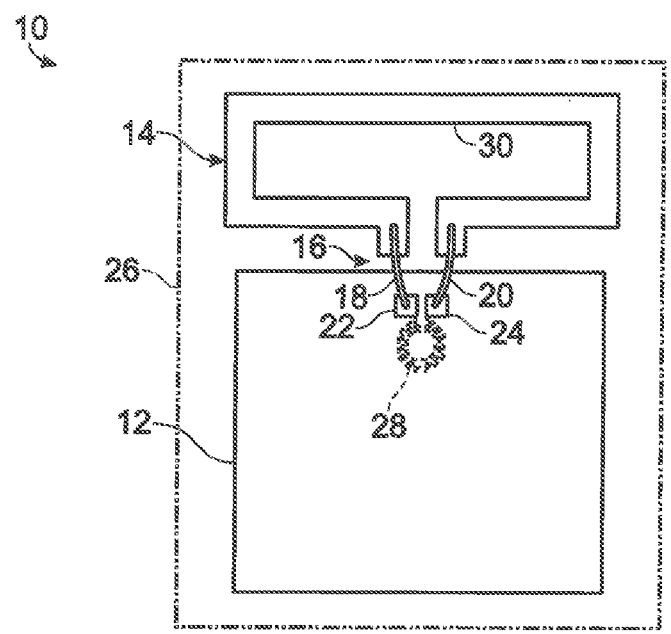
FIG. 1 shows a simplified schematic overhead view of a first example of an integrated circuit (IC) package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with the antennas of the transmitter/receiver pair in close proximity.

As discussed below, a transmitter and/or receiver may be configured as an IC package, in which one or more antennas may be positioned adjacent to a die and held in place by a dielectric or insulating encapsulation or bond material. An antenna may also be held in place by a lead frame substrate. Examples of EHF antennas embedded in IC packages are shown in the drawings and described below. Note that IC packages may also be referred to as simply packages, and are examples of wireless communication units that are also variously referred to as EHF communication units, communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies in a multipart or monolithic assembly and have circuit functionality appropriate for particular applications.

FIG. 1 shows an exemplary IC package, generally indicated at 10. IC package 10 includes a chip or die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 further includes an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 includes any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. Die 12 may have a length and a width dimension, each of which may be about 1.0 mm to about 2.0 mm, and preferably about 1.2 mm to about 1.5 mm. Die 12 may be mounted with further electrical conductors 16, such as a lead frame, not shown in FIG. 1, providing connection to external circuits. A transformer 28, shown in dashed lines, may provide impedance matching between a circuit on die 12 and transducer 14.

Transducer 14 may be in the form of a folded dipole or loop antenna 30, may be configured to operate at radio frequencies such as in the EHF spectrum, and may be configured to transmit and/or receive electromagnetic signals. Antenna 30 is separate from but operatively connected to die 12 by suitable conductors 16, and is located adjacent to die 12.

The dimensions of antenna 30 are suitable for operation in the EHF band of the electromagnetic frequency spectrum. In one example, a loop configuration of antenna 30 includes a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 is used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may also be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

Figure 2:
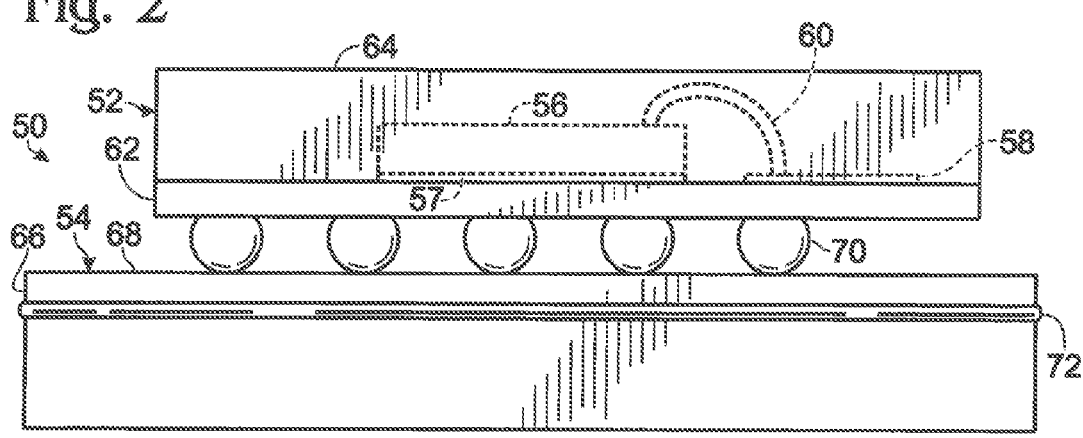
FIG. 2 shows a schematic side view of an exemplary communication device including an IC package and printed circuit board (PCB).

FIG. 2 shows a representational side view of a communication device 50 including an IC package 52 flip-mounted to an exemplary printed circuit board (PCB) 54. In this example, it may be seen that IC package 52 includes a die 56, a ground plane 57, an antenna 58, bond wires, including bond wire 60, connecting the die to the antenna. The die, antenna, and bond wires are mounted on a package substrate 62 and encapsulated in encapsulating material 64. Ground plane 57 may be mounted to a lower surface of die 56, and may be any suitable structure configured to provide an electrical ground for the die. PCB 54 may include a top dielectric layer 66 having a major face or surface 68. IC package 52 is flip-mounted to surface 68 with flip-mounting bumps 70 attached to a metallization pattern (not shown).

PCB 54 may further include a layer 72 spaced from surface 68 made of conductive material forming a ground plane within PCB 54. The PCB ground plane may be any suitable structure configured to provide an electrical ground to circuits and components on PCB 54.

Figure 3:
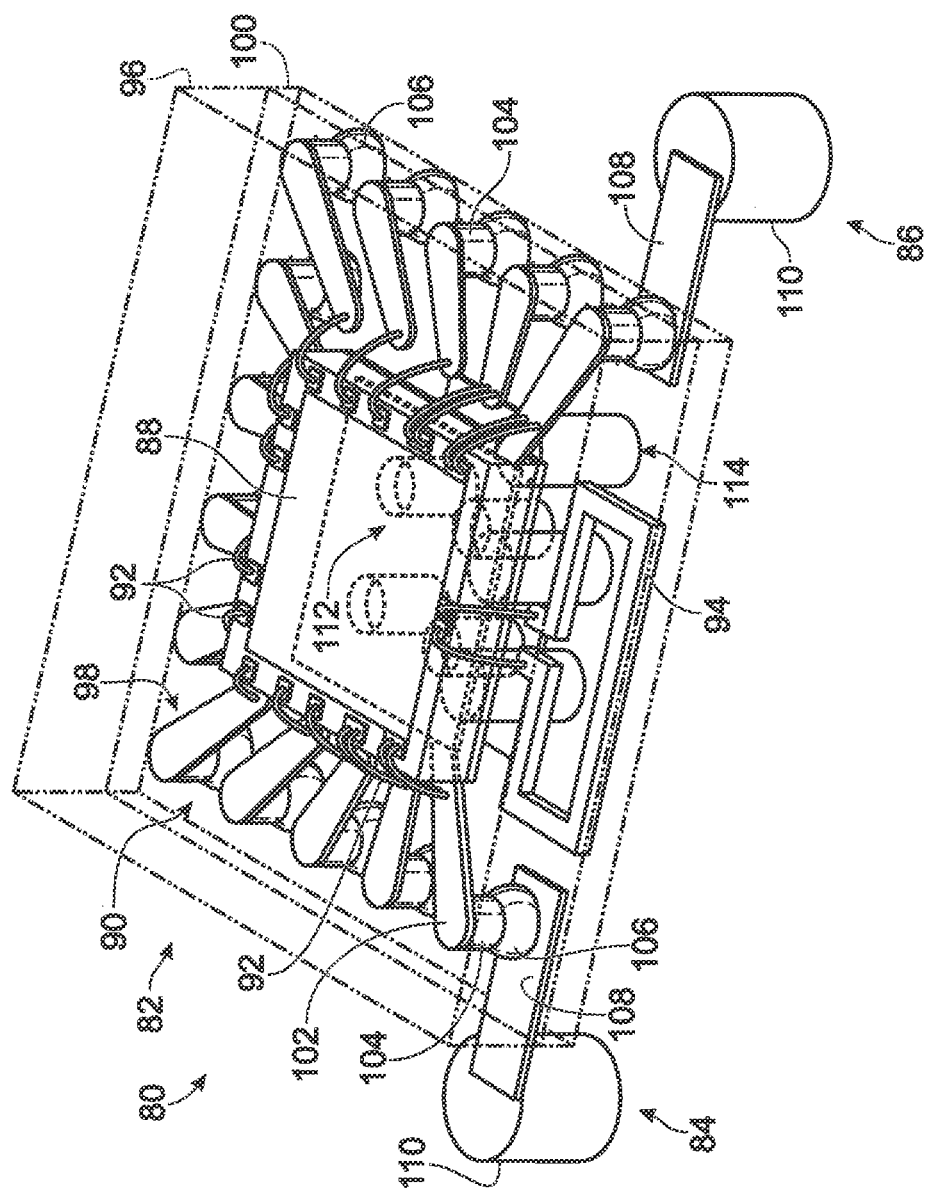
FIG. 3 shows an isometric view of another exemplary communication device including an IC package with external circuit conductors.
Figure 4:
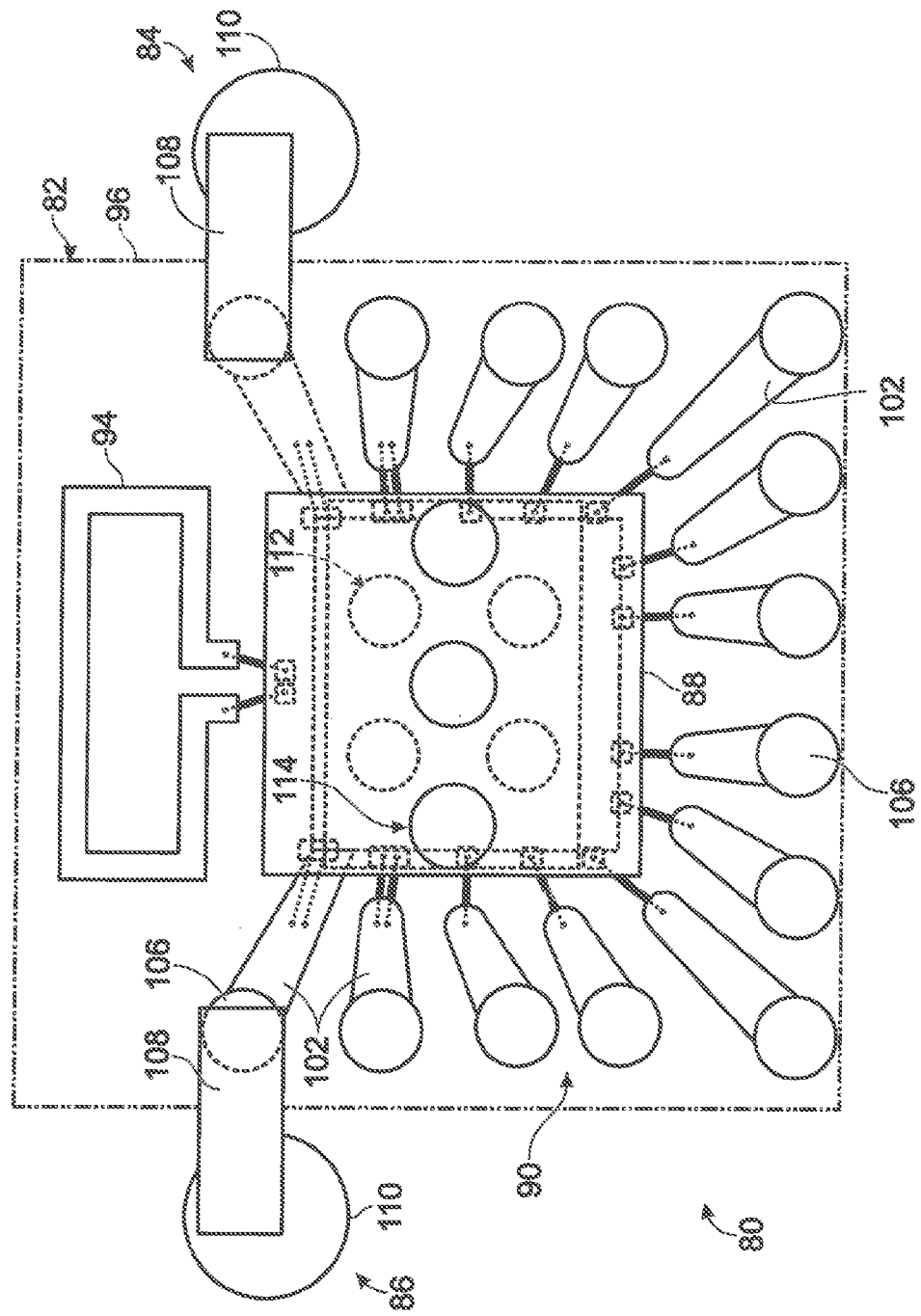
FIG. 4 shows a simplified top view of the exemplary communication device of FIG. 3.

FIGS. 3 and 4 illustrate another exemplary communication device 80 including an IC package 82 with external circuit conductors 84 and 86. In this example, IC package 82 may include a die 88, a lead frame 90, conductive connectors 92 in the form of bond wires, an antenna 94, encapsulating material 96, and other components not shown to simplify the illustration. Die 88 may be mounted in electrical communication with lead frame 90, which may be any suitable arrangement of electrical conductors or leads 98 configured to allow one or more other circuits to operatively connect with die 90. Antenna 94 may be constructed as a part of the manufacturing process that produces lead frame 90.

Leads 98 may be embedded or fixed in a lead frame substrate 100, shown in phantom lines, corresponding to package substrate 62. The lead frame substrate may be any suitable insulating material configured to substantially hold leads 98 in a predetermined arrangement. Electrical communication between die 88 and leads 98 of lead frame 90 may be accomplished by any suitable method using conductive connectors 92. As mentioned, conductive connectors 92 may include bond wires that electrically connect terminals on a circuit of die 88 with corresponding lead conductors 98. For example, a conductor or lead 98 may include a plated lead 102 formed on an upper surface of lead frame substrate 100, a via 104 extending through the substrate, a flip-mounting bump 106 mounting IC package 82 to a circuit on a base substrate, such as a PCB, not shown. The circuit on the base substrate may include external conductors, such as external conductor 84, which for example, may include a strip conductor 108 connecting bump 106 to a further via 110 extending through the base substrate. Other vias 112 may extend through the lead frame substrate 100 and there may be additional vias 114 extending through the base substrate.

In another example, die 88 may be inverted and conductive connectors 92 may include bumps, or die solder balls, as described previously, which may be configured to electrically connect points on a circuit of die 88 directly to corresponding leads 98 in what is commonly known as a "flip chip" arrangement.

A first and a second IC package 10 may be co-located on a single PCB and may provide intra-PCB communication. In other examples, a first IC package 10 may be located on a first PCB and a second IC package 10 may be located on a second PCB and may therefore provide inter-PCB communication.

Figure 5:
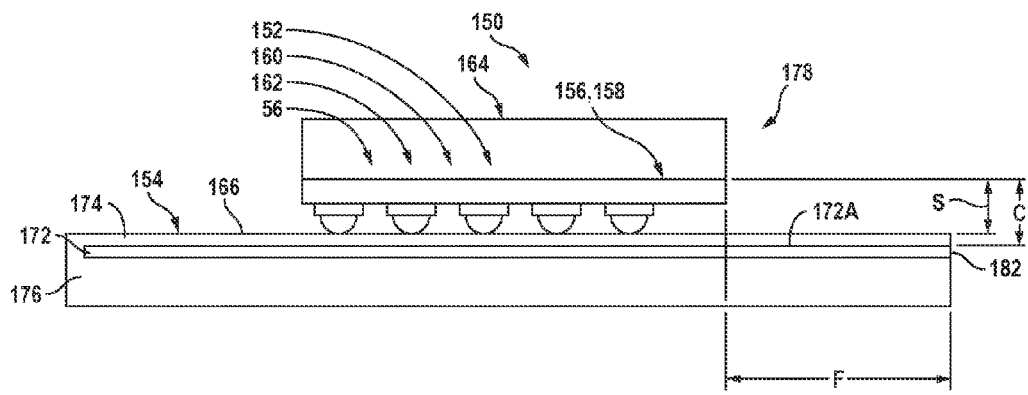
FIG. 5 shows a side view of an exemplary communication device mounted on an exemplary dielectric substrate.

Referring now also to FIG. 5, a system for transmitting and/or receiving signals, generally indicated by system 150, may include a communication circuit 152 and a dielectric substrate 154. Communication circuit 152 may include a transducer 156, e.g., an antenna 158, and a transmitter circuit 160 and/or a receiver circuit 162. Communication circuit 152 may be or may include a communication device 164 and accordingly may be an example of an IC package 10 and include a die 12, conductors 16, 18, 20, and encapsulating material 26 as described with reference to FIG. 1. Device 164 may also be an example of a communication device 50 or 80 as described with reference to FIGS. 2-4. Dielectric substrate 154, e.g., a printed circuit board (PCB), may provide mechanical, electrical, and/or electronic support for communications device 164 and/or other devices. Substrate 154 with major face 166 may be an example of a PCB 54 with a major face 68. Communication circuit 152 or device 164 may be mounted to major face 166 of substrate 154, e.g., by flip-mounting or surface-mounting techniques. System 150 may include additional or alternative elements and may omit one or more elements described.

As mentioned, communication circuit 152 may include transducer 156, and transmitter circuit 160 and/or a receiver circuit 162. Transducer 156 may be an example of transducer 14 configured to convert between RF electrical signals and RF electromagnetic signals. Transducer 156 may receive or transmit extremely high frequency (EHF) radiation having a selected operating frequency and operating wavelength. Transducer 156 may be supported in a position spaced from major face 166 of substrate 154. For example, communication device 164 may be mounted or operatively coupled to substrate 154, e.g., so that transducer 156 maintains a specified, fixed separation from major face 166, indicated as offset distance S. Communication circuit 152 may include an EHF-signal IC transmitting package (and/or receiving package) as discussed above Transmitter circuit 160 may include devices and/or circuitry that transform a baseband signal into an RF signal and conduct the RF electrical signal to transducer 156 for transmission as an RF electromagnetic signal. Receiver circuit 162 may include devices and/or circuitry that receive an RF electrical signal from transducer 156 and transform the electrical signal into a baseband signal.

Substrate 154 may be in the form of a PCB and may include a conductive layer 172, e.g., a ground plane 57, supported by substrate 154 between top dielectric layer 174 and bottom dielectric layer 176 of substrate 154. Conductive layer 172 may be substantially parallel to major face 166. Layer 172 may be vertically spaced or separated from major face 166 by a distance defined by the thickness of top dielectric layer 174. Layer 172 accordingly may be spaced or separated from transducer 156 by a vertical offset distance C, which in this example is approximately the sum of offset distance S and the thickness of top dielectric layer 174. Distance C between transducer 156 and layer 172 may be a preselected distance, e.g., a distance of less than a wavelength of an operating frequency of transducer 156.

In the configuration of FIG. 5, substrate 154 and conductive layer 172 may extend past transducer 156 by a distance F that continues in a direction opposite the position of die 56 in communication device 164. Conductive layer 172 accordingly may extend along major face 166 proximate or adjacent to transducer 156. This extended portion 172a of conductive layer 172, generally corresponding to distance F and facing or aligned with transducer 156, may influence an EM radiation pattern of transducer 156, e.g., by in effect blocking, reflecting, or otherwise directing EM radiation transmitted by or received by transducer 156. For example, radiation transmitted from transducer 156 may be directed upward and away from communication device 164 and the extended portion 172a of conductive layer 172, while radiation received by transducer 156 equivalently may be directed downward and toward transducer 156. Conductive layer 172 may accordingly also be considered an electromagnetic-energy directing assembly 178.

More specifically, conductive layer 172 may terminate on an edge 182 proximate transducer 156, e.g., so that radiation transmitted (and/or received) by transducer 156 is directed away from (and/or toward) transducer 156 in a direction predominantly away from conductive layer 172. For example, the horizontal (X-axis) locations of transducer 156 and terminal edge 182 may together define distance F of portion 172a. If the location of the transducer 156 has been determined, for example, then the location of edge 182 may be selected so that portion 172a directs EM radiation from (to) transducer 156 away from (toward) transducer 156. The location of edge 182 and therefore distance F in relation to transducer 156 may be selected in relation to the operating frequency or wavelength of transducer 156, for example. Features of portion 172a that may influence the direction and shaping of EM radiation may include, e.g., a location of portion 172a adjacent to transducer 156; a parallel alignment of major face 166, conductive layer 172, and transducer 156; a vertical distance C between portion 172a and transducer 156; and a horizontal distance F defining the extent of portion 172a. Distance C may be substantially equal to a distance of less than a wavelength of an operating frequency of transducer 156.

Figure 6A:
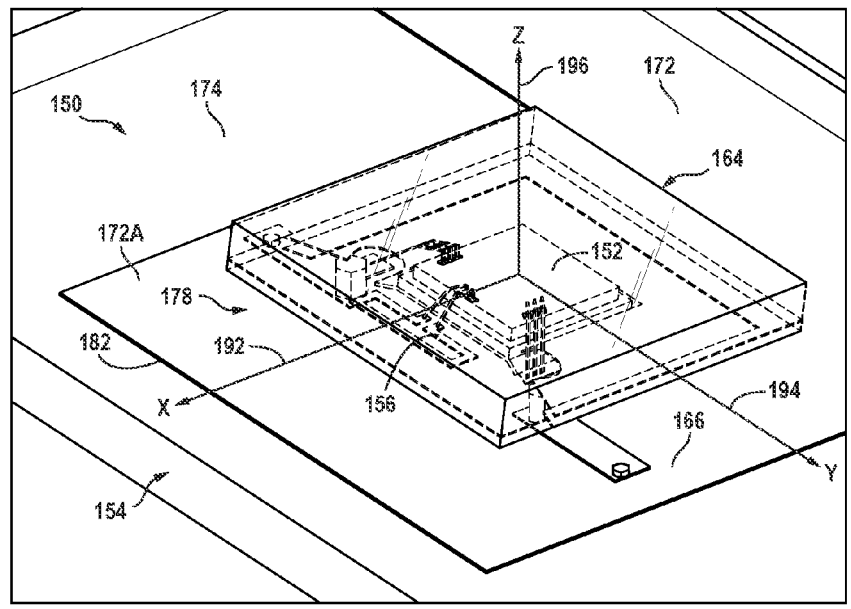
FIG. 6A shows an isometric view of an exemplary system for transmitting or receiving signals that includes a communication device mounted on a dielectric substrate.

FIG. 6A is an isometric view of communication system 150. It is seen that conductive layer 172 may extend in a plane along major face 166 of substrate 154 in all directions from transducer 156 to bounding edges spaced from the transducer.

FIG. 6B is an isometric view of communication system 150 with the addition of a vertical plane 198 shown in dashed lines that illustrates a simulation of the distribution of the electric field around transducer 156, represented by EM radiation pattern 190. For clarity of description, FIG. 6B includes reference axes or lines 192, 194, and 196. Reference line 192 may be an X axis parallel to substrate 154 and passing through transducer 156; line 194 may be a Y axis parallel to substrate 154 at right angles to line 192; and line 196 may be a Z axis perpendicular to lines 192 and 194. Reference plane 198 is in an XZ plane defined by lines 192 and 196, transverse to transducer 156 and substantially perpendicular to substrate 154. Measuring or computationally simulating the strength of an EM field of transducer 156 on plane 198 yields the EM radiation pattern 190 with field strength simplistically shown by representative dashed lines following approximate field strength contours on plane 198.

It is seen that in this example the overall structure of communication system 150, including directing assembly 178, may direct or redirect energy transmitted by or received by transducer 156 in a direction generally away from conductive layer 172. For transmission, for example, this redirection of EM energy may be generally upwardly (vertically away from portion 172a for the orientation illustrated) and somewhat horizontally away from communication device 164.

FIG. 6C shows a simulated pattern 199 of antenna gain associated with the configuration of communication system 150 of FIGS. 5 and 6A. Each contour line in the graph connects points with a selected value of antenna gain. The several contour lines show that value of gain generally decreases with increasing distance from transducer 156. The rate of decrease may differ according to direction (i.e., contour lines may be asymmetrical with respect to transducer 156), and the form and direction of the asymmetry may be influenced by nearby conductive materials, and in particular by extended portion 172a of conductive layer 172. As with radiation pattern 190 of FIG. 6B, the antenna gain of FIG. 6C extends generally upwardly (i.e., vertically, toward the positive half of Z-axis line 196) and slightly away from (i.e., horizontally, toward the positive half of X-axis line 192) communication device 164 and portion 172a of conductive layer 172.

It is seen that directing assembly 178 may be effective to provide communication with another communication device disposed in the field produced by transducer 156, which would be above communication device 164 in these figures. It will be apparent that the radiation and field patterns may vary if there are other structures not shown that affect the propagation of EM energy. In these examples, no such additional structures are present in the region proximate the transducer. However, additional or alternative shaping of the EM radiation may also be accomplished by configuring conductive layer 172 relative to communication device 164. For example, it may be desired to redirect more of resulting radiation pattern 190 in the X-direction from communication device 164. The shaping, deflection, or direction of EM signal may generally depend on the configuration of conductive layer 172 relative to transducer 156 embedded at an edge of device 164 (the right edge, as viewed in FIG. 5). For example, a shortened conductive layer portion, such as that shown for conductive layer 72 in FIG. 2, may produce a radiation pattern directed more in the X-direction. In FIG. 2, the conductive layer ends proximate to the transducer.

Figure 7A:
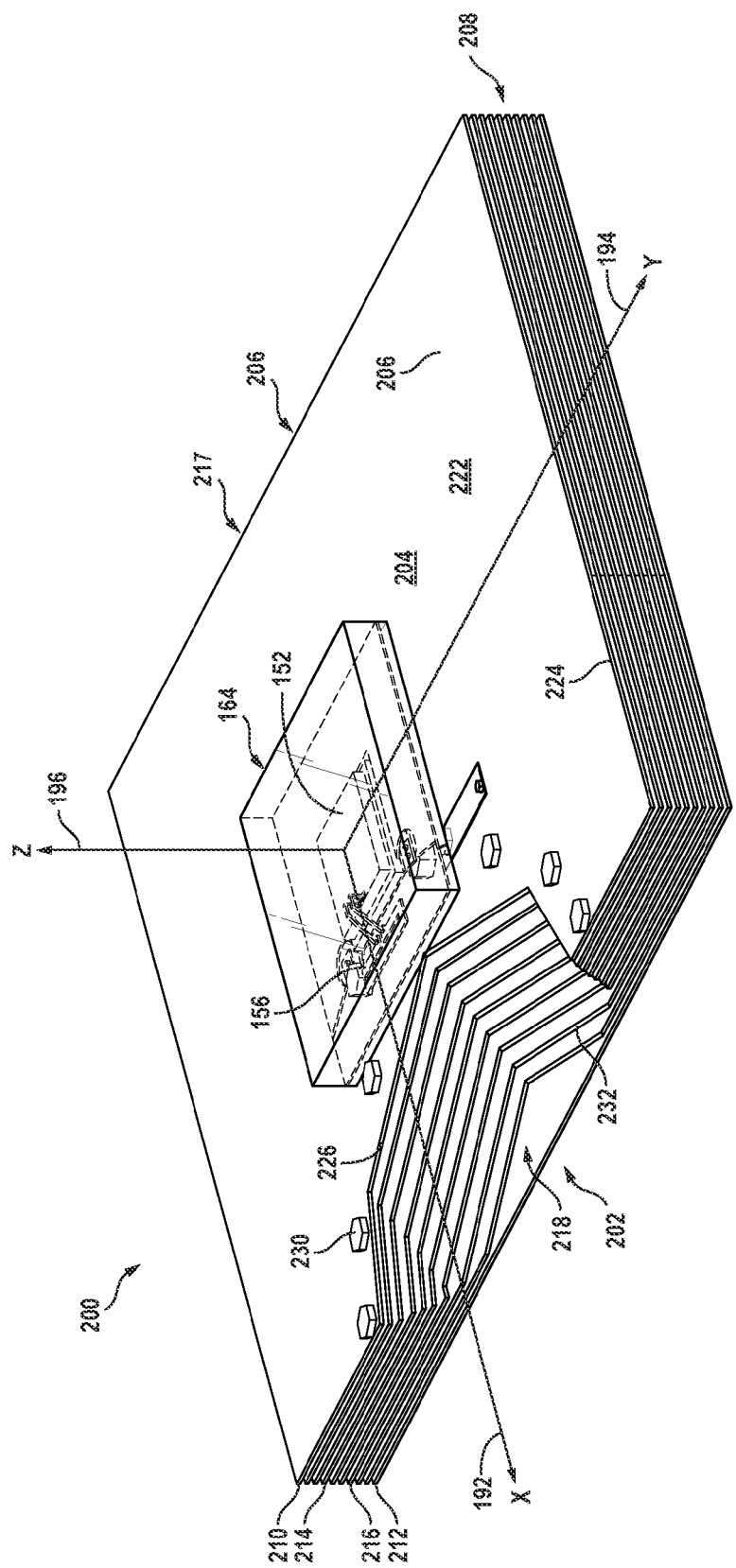
FIG. 7A shows an isometric view of an exemplary communication device mounted on a dielectric substrate having an EM energy directing assembly.

FIG. 7A shows a representative embodiment of a communication system 200 that includes a layered embodiment of an EM energy directing assembly, indicated generally at 202. Communication system 200 may include a communication device 164 as described previously. Device 164 is mounted on a major face 204 of a substrate assembly 206, such as, a PCB 206. PCB 206 is illustrated more clearly in FIGS. 8 and 9 discussed further below. As viewed in the figures, PCB 206 includes a plurality of conductive layers 208, including a top conductive layer 210 having major face 204, a bottom conductive layer 212, and a plurality of intermediate layers 214. The conductive layers are supported in spaced-apart positions by intervening dielectric layers 216 formed in PCB 206. Dielectric layers 216 may form what may be considered a composite dielectric substrate 217 in which the conductive layers are embedded. Conductive layers 208, configured as directing assembly 202 described further below, may serve to shape or direct an EM radiation pattern of adjacent transducer 156 of communication device 164.

In some embodiments including the directing assembly of FIG. 7A, a plurality of conductive layers 208 may include respective recesses 218 formed in ends adjacent to transducer 156. Recesses 218 may create an amphitheater or dish shape. A plan view of directing assembly 202 is shown enlarged in FIG. 8 and a cross-section view is shown in FIG. 9, and is described in further detail below with reference to those figures. In communication system 200, an outer edge of transducer 156 is aligned with the inner-most point of the recess in top conductive layer 210.

Figure 7B:
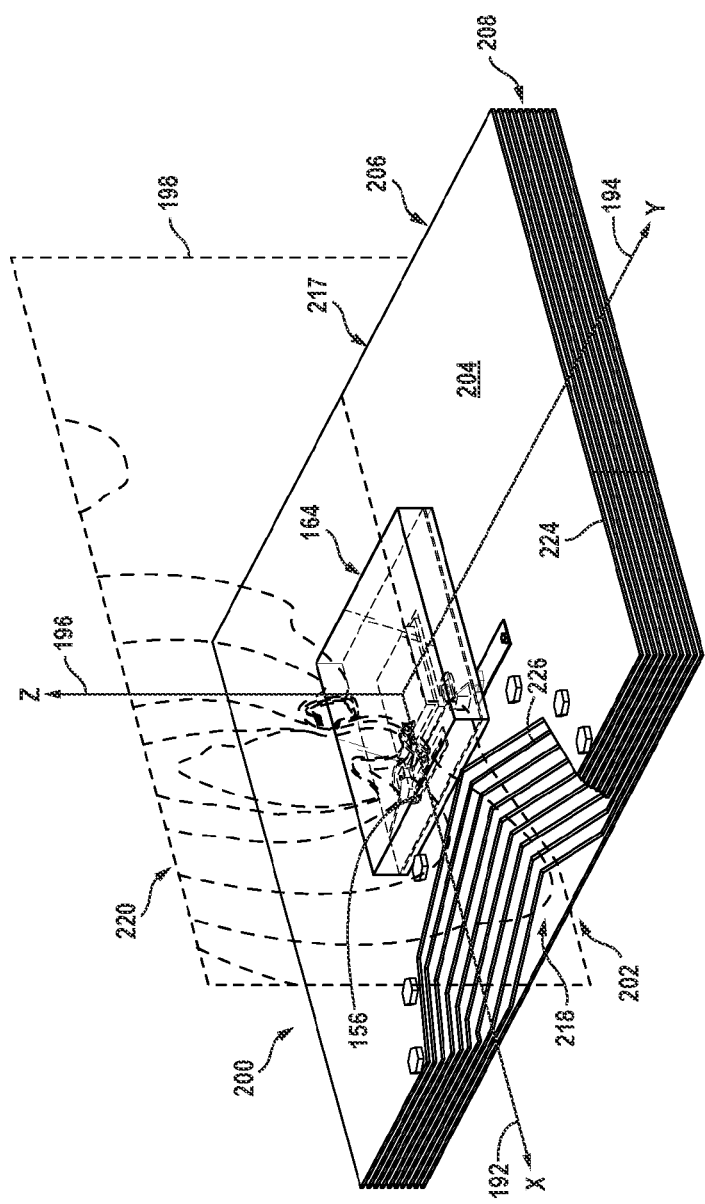
FIG. 7B is a diagram similar to FIG. 7A that includes an indication of a representative associated EM radiation pattern.

With transducer 156 disposed above or proximate to directing assembly 202, the function of communication system 200 may be altered from the function illustrated in FIGS. 6A-6C. To aid in visualizing and characterizing a radiation pattern 220 associated with dish-shaped directing assembly 202, FIG. 7B, which is a view of communication system 200 similar to FIG. 7A, includes reference lines 192, 194, and 196 arranged as coordinate axes having an origin on communication circuit 152. FIG. 7B further includes a reference plane 198 corresponding to the plane of the X-Z axis. Plane 198 in this example illustrates a graph of simulated EM radiation pattern 220 existing in the plane.

As in FIG. 6B, each contour line in FIG. 7B corresponds to points in the radiation pattern having the same magnitude. Radiation pattern 220 may be seen to generally extend upwardly above transducer 156 and communication circuit 152. Additionally, radiation pattern 220 may be seen to generally tilt from vertical in the positive X dimension away from transducer 156 and communication circuit 152. It is seen that radiation pattern 220 produced using directing assembly 202, may extend farther in the positive X direction than radiation pattern 190.

Figure 7C:
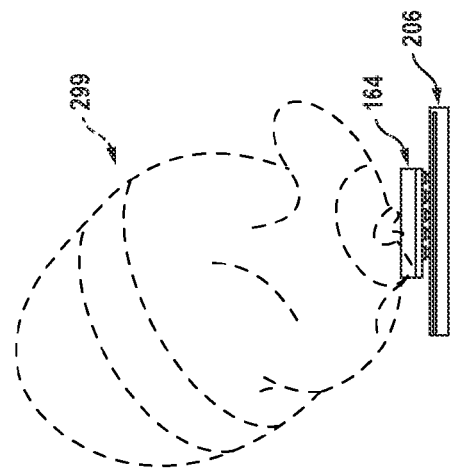
FIG. 7C is an illustration of an exemplary representation of antenna gain for the system of FIG. 7A.

FIG. 7C shows radiation pattern 299 relative to communication system 200. As with radiation pattern 199 shown in FIG. 6C, radiation pattern 299 shows the gain of transducer 156. Each contour line in the graph connects points with a selected value of antenna gain. As with radiation pattern 220 of FIG. 7B, the antenna gain extends generally upwardly at a transverse angle extending in the positive X-direction and away from communication circuit 152 relative to the transducer.

Figure 8:
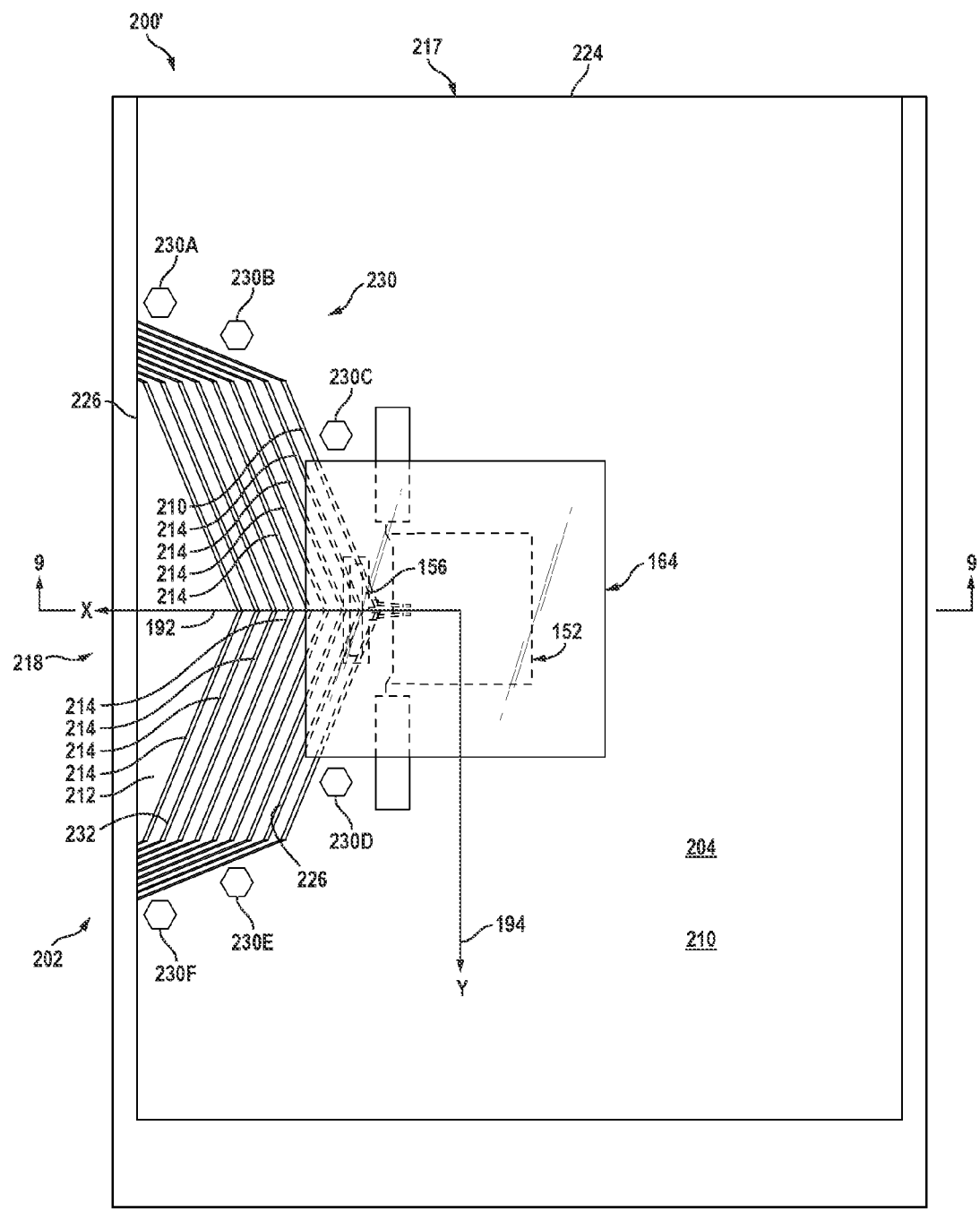
FIG. 8 shows a plan view of an illustrative communication device mounted on a dielectric substrate having an EM energy directing assembly.
Figure 9:
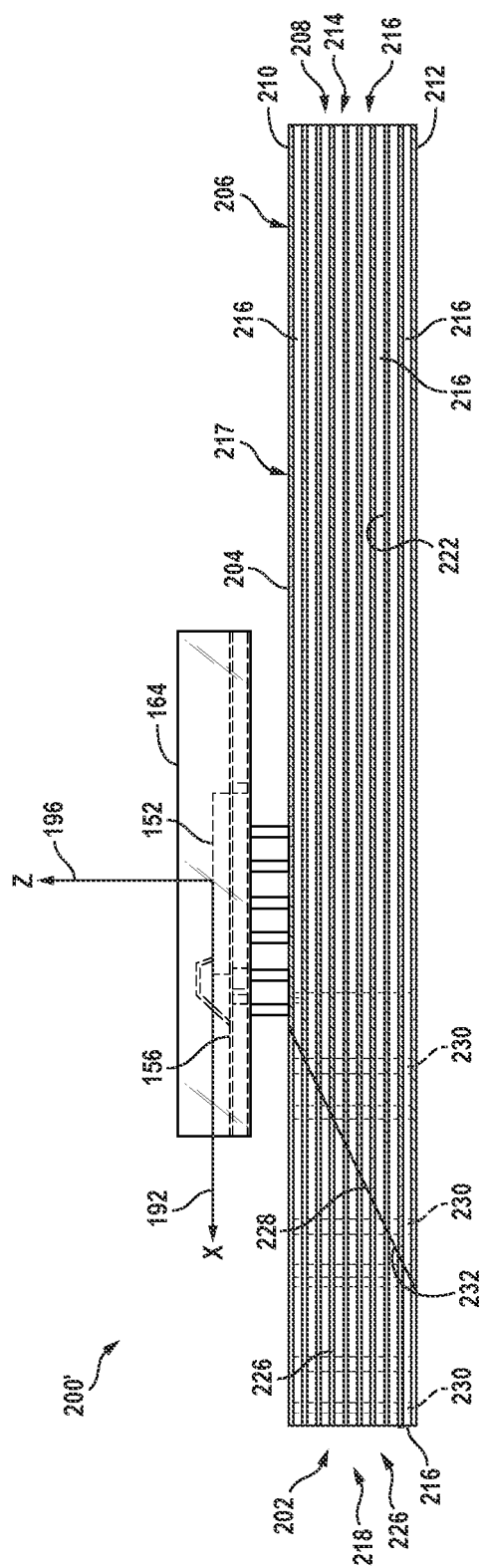
FIG. 9 shows a cross-section taken along line 9-9 in FIG. 8.

FIGS. 8 and 9 show a representative system 200' similar to system 200 shown in FIG. 7A. FIG. 8 shows a plan view of system 200', while FIG. 9 shows a side cross-sectional view of system 200' taken along line 9-9 in FIG. 8. System 200' includes a communication device 164 mounted on layered dielectric substrate assembly 206. The descriptions of system 200 above apply to system 200' with the exception of the placement of communication device 164 on substrate assembly 206. In this example, transducer 156 extends out over recesses 218 in directing assembly 202 as shown in FIGS. 8 and 9.

Referring now to substrate assembly 206, as described above, conductive layers 208 may be spaced or separated from adjacent conductive layers 208 by respective dielectric layers 216. The thickness of the dielectric layers 216 determines the distance between the associated adjacent conductive layers 208. For example, adjacent conductive layers 208 may be spaced apart by a distance substantially less than an operating wavelength of transducer 156.

Although not shown, dielectric layers may also be disposed on outer planar surfaces (the major faces of substrate assembly 206). Substrate assembly 206, as shown, has alternating conductive layers 208 and dielectric layers 216. Accordingly, substrate assembly 206 may be considered to include a series of spaced-apart, embedded conductive layers.

Substrate assembly 206 thus serves as a device for directing EHF EM radiation. In this example, substrate assembly 206 may include dielectric substrate 217 configured to support an electromagnetic transducer 156 in a transducer position, and a directing assembly 202 supported by the substrate relative to the transducer position. Directing assembly 202 may include a plurality of spaced-apart embedded conductive layers 208 disposed in composite dielectric substrate 217. Each conductive layer 208 of the plurality of embedded layers 208 may have a major surface 222 with a first perimeter 224. The first perimeters 224 may include perimeter portions 226 proximate the transducer 156 that are offset relative to each other as viewed from the transducer in a manner exposing each perimeter portion 226 to the transducer 156, such as is shown in FIG. 8.

Referring specifically to FIGS. 8 and 9, each conductive layer 208 may have a major surface 222 that faces transducer 156. The distance between major faces 222 of adjacent conductive layers 208 may be approximately the sum of the thicknesses of the separating dielectric layer 216 and an associated conductive layer 208. Each major surface 222 may have a perimeter 224 defined by the exterior edge of the major surface 222 of the associated layer 208. The perimeter 224 may have a first perimeter portion 226 that is adjacent or proximate to transducer 156. Perimeter portions 226 of the plurality of layered conductive layers 208 of substrate assembly 206 may be offset from each other as viewed from transducer 156 in a manner exposing each perimeter portion 226 to transducer 156.

For example, conductive layers 208 may be configured to create an electromagnetically stair-stepped or offset layer configuration of substrate assembly 206 in the region adjacent to transducer 156. Each conductive layer 208 may represent one step, where the tread length is ultimately defined by a horizontal distance from transducer 156 (in effect, a distance between the adjacent layer edges in perimeter portions 226 as viewed in FIG. 8, which is along a plane parallel to the X-Z plane) and the rise height by the orthogonal distance between the major surfaces 222 of adjacent conductive layers 208. Horizontal distances ('run' distances in a plane parallel to the X-Y plane) may be generally constant or vary from the top conductive layer 210 (forming or adjacent to major face 204 of substrate assembly 206) to the bottom conductive layer 212 (farthest or opposite from major face 204).

In perimeter portions 226 of directing assembly 202, the edge of each conductive layer (except bottom layer 212) underlaps the conductive layer below it so that a portion of the lower layer is exposed to transducer 156. The underlapped arrangement of conductive layers 208, combined with a progressive decrease in distance in the X direction (corresponding to distance F as shown in FIG. 5) for each successive conductive layer, may expose an edge, 'tread', or 'run' portion of the upper major face 204 of each conductive layer. The horizontal (run) and vertical (rise) distances may be selected so that transducer 156 can "see" the exposed tread portion of the major surface 222, or at least the edge of each conductive layer 208 along its perimeter portion 226. For example, a slope or pitch defined by stepped perimeter portions 226 may be selected to so that an upper conductive layer 208 does not block a line of sight from transducer 156 to the perimeter portion 226 of a lower layer 208. By maintaining these lines of sight to exposed perimeter portions, radiation transmitted by or received by transducer 156 may be exposed to and affected by the perimeter portions of the conductive layers.

The horizontal (X-Y) and/or vertical (Z) distances that define the extent of overlap may be selected so that a line 228 connecting adjacent intersections of perimeter portions 226 by a plane transverse to major surfaces 222, e.g., reference plane 198, has a desired configuration. For example, plane 198 may intersect perimeter portions 226 along a rectilinear line 228 as shown in FIG. 9. For example, all steps may have the same run length and the same rise height, so that the perimeter portions of layers 208 define a straight-line pitch, as exists for directing assembly 202.

In an embodiment, one or more perimeter portions 226 may include a notch or recess 218 formed in perimeter portions 226. In the example of FIG. 8, for instance, substrate assembly 206 includes ten conductive layers 208. In this example, the top nine conductive layers 208 include recesses 218, and the nine recesses 218 are arranged together and aligned on the edge of substrate assembly 206 closest to transducer 156. A conductive layer may omit recess 218. In FIG. 8, for example, bottom layer 212 does not include a recess 218.

The recesses 218 of the conductive layers may differ in size and/or shape. Each recess 218 may be any suitable shape that may be cut out, removed from, or otherwise formed as an end or perimeter region of the corresponding conductive layer. For example, recess 218 (and correspondingly, perimeter portion 226) may be generally concave, and may be curvilinear, rectilinear, or a combination of curvilinear and rectilinear. For example, in a series of conductive layers 208, a progressive increase in the size of similarly shaped recesses, arranged with the largest recess adjacent major face 204 (i.e., in top conductive layer 210) and the smallest recess opposite major face 204 (i.e., in or toward bottom conductive layer 212), may yield a conductive-layer stepped, amphitheater-like directing assembly 202 like that shown in FIGS. 8-9. A conductive layer 208 may have zero, one, or multiple recesses 218. For example, configuring selected layers 208 of a directing assembly with two adjacent recesses may create a bifurcated example of directing assembly 202.

Transducer 156 may be disposed along a plane of major face 204 in alignment with perimeter portions 226 and adjacent to major face 204. For example, in the recessed embodiment of directing assembly 202 of FIG. 7A, transducer 156 is mounted coplanar to major face 204, offset above major face 204 by a specified vertical distance, aligned with an axis of transducer 156 parallel to perimeter portions 226, and centered on the apex of the notch-shaped recesses 218. Communication device 164 may be mounted with transducer 156 overhanging a directing assembly 202 to varying degrees. In some examples, device 164 may be mounted with transducer 156 directly over an edge of the recess 218 in top layer 210 of directing assembly 202, e.g., as shown in the embodiment of FIG. 7A. In other examples, device 164 may be mounted with transducer 156 farther out, such that a larger portion of the directing assembly 202 falls under transducer 156, e.g., as shown in the embodiment of FIGS. 8 and 9.

Dielectric material may fill in the space formed by recesses 218 and may form a substantially continuous and substantially planar top mounting surface of substrate 206.

A directing assembly 202 may include one or more conductive vias 230 that establish and maintain electrical communication between two or more conductive layers 208. Vias 230, such as, vias 230A-F shown in the example of FIG. 8, may be any suitable conductive structure connecting one or more conductive layers 208. Vias 230 may also connect to other conductive structures having a desired electrical potential, e.g., that of an electrical ground. Because vias 230 are conductive, vias 230 may be used to bring all conductive layers 208 to substantially the same potential, e.g., that of an electrical ground.

The electrical communication of vias 230 may be accomplished by any suitable arrangement. For example, several vias 230 may pass through and connect all conductive layers 208, as shown in the example of FIGS. 8 and 9. In other examples, one or more vias 230 may be placed between each pair of conductive layers 208. In still other examples, one via 230 may connect two layers 208, another via 230 may connect three layers 208, and another may connect four layers 208. Various such arrangements are possible. For example, it is also possible to have the vias capacitively coupled to the various layers. This would allow the layers to be at different DC potentials if required (such as to accommodate supply levels, etc.) while maintaining their connectivity at a design operating frequency, such as 60 GHz. In any arrangement, proper equalization of potential may be facilitated by positioning vias 230 as close to step edges 232 as possible. The plurality of vias 230 accordingly may be distributed along perimeter portions 226.

To facilitate redirection of transmitted radiation in the positive X direction, system 150, 200, or 200' may further include an opposing conductive layer 250.

Figure 10A:
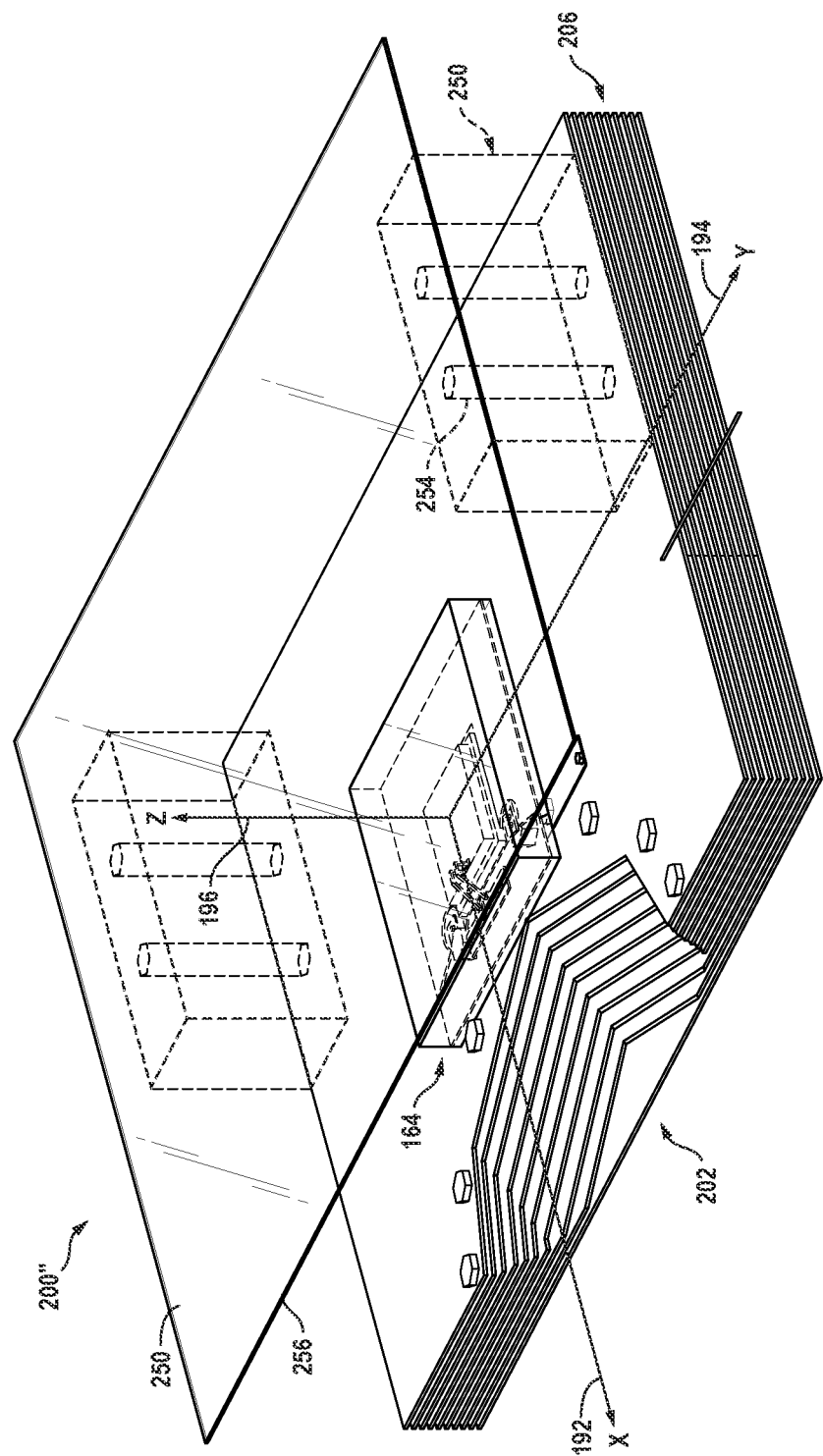
FIG. 10A shows an isometric view of an exemplary communication device similar to the communication device of FIG. 7A.

FIGS. 10A and 10B illustrate a communication system 200", which corresponds to system 200 with the addition of an opposing conductive layer 250. Systems 150 and 200' may also be modified to include an opposing layer 250. Opposing layer 250 may include any suitable conductive component or element disposed above communication device 164 and configured to reflect EM radiation to or from transducer 156. Opposing layer 250 may extend along major face 204 (or 166) of substrate 206 (or 154), e.g., by occupying an area offset from major face 204 (or 166) that covers all or part of the area of the major face. Opposing layer 250 may be spaced from transducer 156, e.g., by occupying a plane separated from the major face by a specified vertical opposition distance O. Transducer 156 may be disposed between directing assembly 202 (or 178) and opposing layer 250—i.e., opposing layer 250 may be located above transducer 156 and major face 204 or 166 may be located below transducer 156. Here and elsewhere, "above" may refer to an increasing Z-axis direction and "below" to an decreasing Z direction, as indicated by reference line 196 in FIG. 10A.

For example, a substantially planar conductive structure 250 may be mounted or installed parallel to the major face of substrate 206 (or 154) at a distance O above the major face on the order of one wavelength of the expected EHF signal. In some embodiments, with an expected EHF signal at 60 GHz, a planar opposing layer 250 may be disposed approximately 1.5 mm above major face 204 or 166, for example.

Opposing layer 250 may have or include associated dielectric material, e.g., one or more dielectric layers, e.g., to provide insulating outer faces. A suitable configuration of dielectric and/or conductive material may fill all or part of the space between major face 204 or 166 and opposing layer 250. For example, stand-offs 252 made from dielectric material that include one or more conductive vias 254 may operatively connect substrate assembly 206 or 154 with opposing layer 250. Mechanically, these stand-offs 252 may maintain a specified spacing distance O between opposing layer 250 and major face 204 or 166; electrically, the vias 254 may bring opposing layer 250 to the same potential as a connected structure, e.g., conductive layers of substrate 206 or 154. Opposition distance O may be a single distance, e.g., when major face 204 or 166 and conductive layer 210 (or 172 in FIG. 5) are substantially parallel planes. Distance O may differ between corresponding points of major face 204 or 166 and conductive layer 210 or 172, e.g., if opposing layer 250 is a non-planar and/or slanted with respect to major face 204.

Opposing layer 250 may have a first perimeter 256—i.e., an exterior edge surrounding its area. Perimeter 256 may have any suitable shape and may include rectilinear or curvilinear segments or combinations thereof. For example, a portion of perimeter 256 over the recess 218 of a directing assembly 202 may have a convex or concave shape aligned with transducer 156.

Inclusion of an opposing layer 250 may further redirect transmitted radiation in the positive X direction. FIG. 10B, like FIG. 7B, includes references axes 192, 184, and 196 as well as a reference plane 198. Plane 198 shows contour lines for an illustrative, simulated EM radiation pattern 260 for the structure of FIG. 10A. As depicted, the radiation pattern 260 is significantly tilted in the positive X direction. FIG. 10C, generally similar to FIG. 7C, shows a representative antenna gain pattern 262 for the exemplary configuration of FIGS. 10A and 10B.

Figure 11:
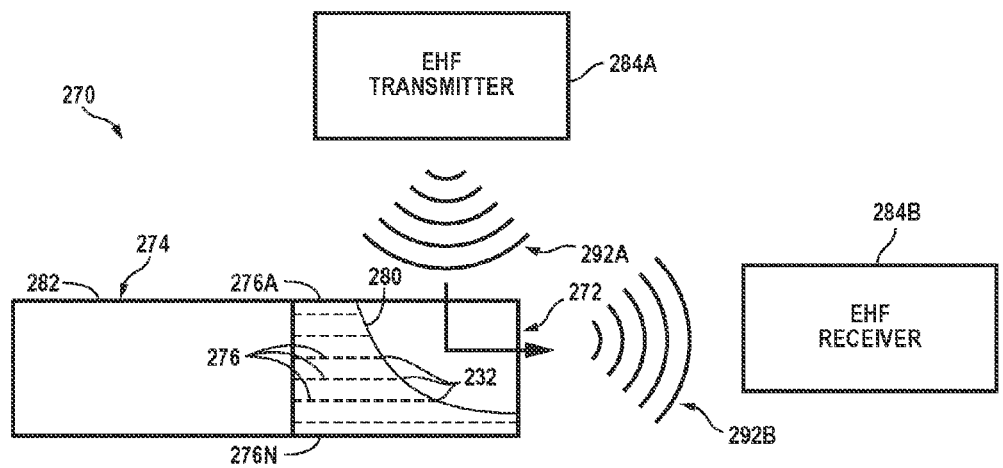
FIG. 11 shows a simplified side view of an exemplary communication system having further example of an EM energy directing assembly.

As mentioned elsewhere, the horizontal (X-Y) and/or vertical (Z) distances that define the extent of offset of perimeter portions or equivalent conductive elements of a directing assembly may be selected so that a line connecting adjacent intersections of perimeter portions by a plane transverse to the perimeter portions has a desired configuration. FIG. 11 shows a simplified cross-sectional view of an illustrative system 270 including a directing assembly 272 formed in a multi-layer substrate assembly 274. The sectioning plane of FIG. 11 is an XZ plane transverse to the major surfaces of the embedded conductive layers 276, e.g. coplanar to plane 198 in FIG. 7B.

In this example, the horizontal (run portion) and/or vertical (rise portion) step distances may increase by unequal amounts, so that a plane transverse to the major surfaces of the conductive layers 276 intersects the associated perimeter portions 278 along a curvilinear line 280. Curvilinear line 280 may be concave as viewed from transducer 156 to preserve the line of sight from transducer 156 to each exposed perimeter portion of a conductive layer 276. This intersecting line may have a shape appropriate for a particular application, and may include both rectilinear and curvilinear segments. Horizontal distances ('run' distances in a plane parallel to the X-Y plane) may generally increase from the top conductive layer 276A (forming or adjacent to major face 282 of substrate 274) to the bottom conductive layer 276N (farthest or opposite from major face 282).

In the example of FIG. 11, system 270 includes a first communications circuit 284A, a second communications circuit 284B, and a layered dielectric substrate 274 that includes directing assembly 272. First communications circuit 284A or transmitter 284A may include an EHF transmitter circuit 160 and a transducer 156. Second communications circuit 284B or receiver 284B may include a transducer 156 and EHF receiver circuit 162. Circuits 284A and 284B may be operationally compatible, e.g., configured so that circuit 284B may receive a signal from circuit 284A. Circuits 284A and 284B are shown independent from implementation details, e.g., IC packaging, in order to highlight logical relationships between transmission by circuit 284A and reception by circuit 284B. For simplicity, circuit 284A is depicted and described as transmitter-only, and circuit 284B as receiver-only. Circuits 284A and 284B may include both transmitter circuits and receiver circuits, e.g., to enable bidirectional communication between circuits 284A and 284B.

Substrate 274 may include a layered structure like that of FIGS. 8 and 9 that includes a series of conductive layers 276. As in FIGS. 8 and 9, each layer 276 may include a perimeter portion 286 that may include a recess 288. Each perimeter portion 286 may have a terminal step edge 290 defining the end of the conductive layer 276 on the open side of directing assembly 272. While each recess 288 may be rectilinear and/or curvilinear in the XY plane, a cross-sectional view in a plane orthogonal to major face 282 (that is, in the YZ plane, transverse to the major surfaces of the conductive layers 276) may show a series of conductive step edges 290 that together define line 280. The exposed surfaces of the intervening dielectric layers may follow the curvature of line 280 or be stepped consistent with the associated conductive layers. Depending on the configuration of the perimeter portions 286, line connecting the intersections of step edges 290 along the sectioning plane may be rectilinear, curvilinear, or both. Curvilinear line 280 may define a concave curve, e.g., as shown in FIG. 11. This arrangement may create an upwardly angled dish-shaped structure of directing assembly 272, e.g., an assembly 272 with a generally concave shape in both the XY and the YZ planes.

Directing assembly 272 may serve to redirect EM radiation 292A from transmitter 284A to a receiver 284B. For example, transmitter 284A may generate transmitted EM radiation 292A proximate to or directed toward assembly 272. Directing assembly 272, by way of a curved surface shown in cross-section as line 280, may redirect transmitted EM radiation 292A toward receiver 284B, e.g., as indicated by redirected radiation 292B. By selectively shaping or directing EM radiation 292A, directing assembly 272 may increase the signal strength of radiation 292A received by receiver 284B. This higher signal strength may improve the signal-to-noise ratio of system 270, for example, or may allow an increase in the working distance between transmitter 284A and receiver 284B.

In another example, a directing assembly may be made with a substrate assembly that does not include conductive layers on the face of the recesses as has been described with reference to directing assemblies 202 and 272. For example, the conductive layers may be replaced with dielectric layers having the same or lower dielectric constants than that of the described dielectric layers, such as dielectric layers 216. Where the dielectric constants are the same in the directing assembly, a homogeneous dielectric substrate or PCB may be used that is contoured to have a desired shape, such as the shape described with regard to recesses 218 of directing assembly 202 and recesses 288 of directing assembly 272. Other combinations of dielectric materials and conductive layers may also be used.

Figure 12:
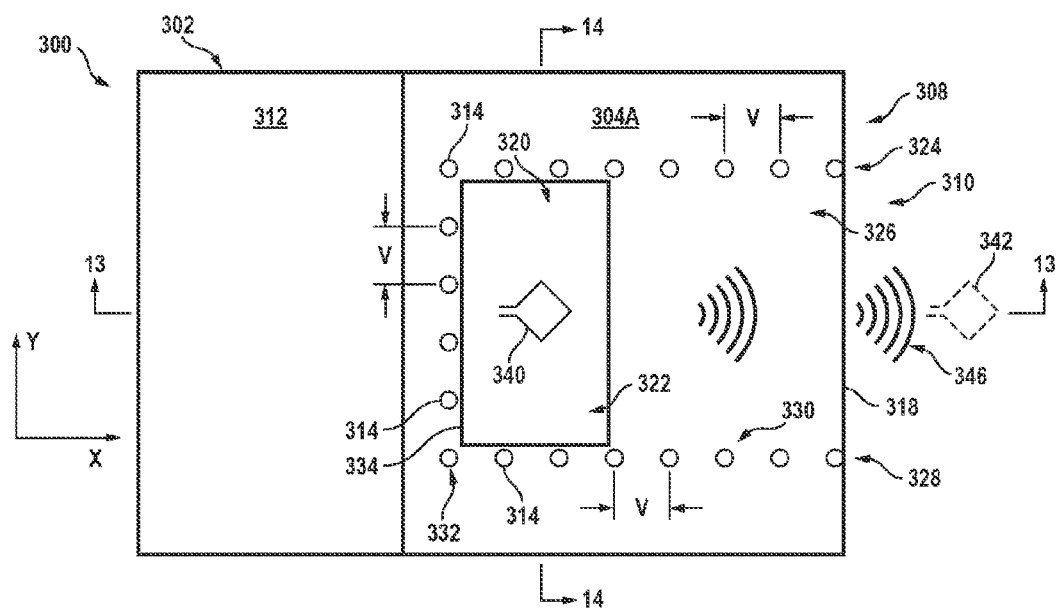
FIG. 12 shows an overhead view of an illustrative dielectric substrate assembly having an exemplary waveguide structure.
Figure 13:
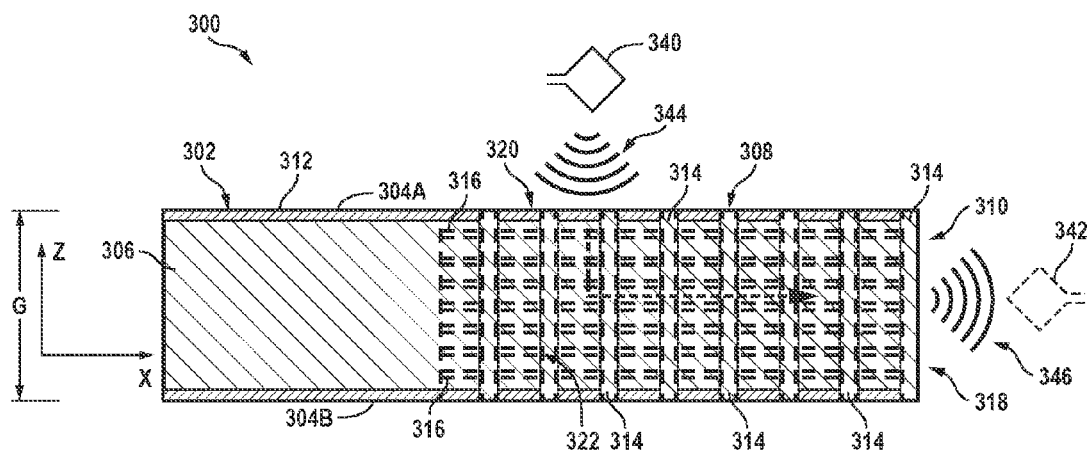
FIG. 13 shows a cross-section taken along line 13-13 of FIG. 12.
Figure 14:
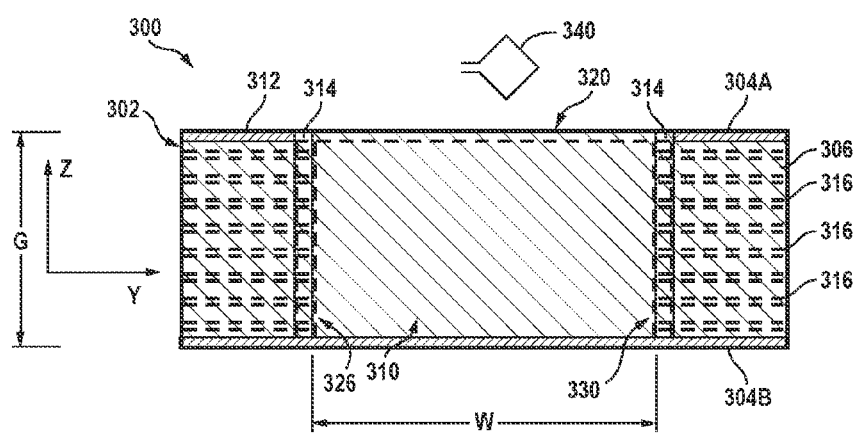
FIG. 14 shows a cross-section taken along line 14-14 of FIG. 12.

FIGS. 12-14 depict another example of a system for directing EHF EM radiation, indicated generally as system 300. As shown in FIG. 12 (an overhead plan view), FIG. 13 (a cross-sectional side view taken along line 13-13 in FIG. 12), and FIG. 14 (a cross-sectional end view taken along line 14-14 in FIG. 12), system 300 may include a dielectric substrate assembly 302 that may include a first conductive layer 304A, a second conductive layer 304B, a dielectric layer 306, and a plurality of conductive components 308. Substrate assembly 302 may be configured to define a waveguide 310 extending through dielectric layer 306 as detailed below.

First conductive layer 304A may be an example of a conductive layer 172 disposed proximate major face 312 of substrate assembly 302. Second conductive layer 304B may be another example of a conductive layer 172 disposed opposite major face 312 (that is, below first conductive layer 304A) and substantially parallel to first conductive layer 304A. Dielectric layer 306 may extend between first and second conductive layers 304A and 304B. Dielectric layer 306 may support conductive layers 304A and 304B and maintain a spacing distance G between them. Distance G may be approximately defined by the thickness of dielectric layer 306. Substrate assembly 302 may include additional dielectric material (not shown), e.g., above first conductive layer 304A and/or below second conductive layer 304B, e.g. to provide insulating outer surfaces.

Substrate assembly 302 may also include a plurality of electrically conductive components 308 connected to and extending between first conductive layer 304A and second conductive layer 304B. Components 308 may include a plurality of conductive vias 314, e.g., to electrically connect layers 304A and 304B. Vias 314 may additionally connect to and establish electrical communication with other conductive structures, e.g., structures at a selected electrical potential such as ground potential, and so on.

Vias 314 may be separated from each other by a spacing interval V, e.g., a horizontal (XY) distance selected according to the properties of an associated EM transducer 156. For example, interval V may be selected to substantially less than one wavelength of an operating frequency of an associated transducer 156. Vias 314 may be distributed within substrate assembly 302 in a specified configuration. For example, vias 314 may be distributed to define a three-sided volume, open on one side at an opening 318, within dielectric assembly 302, e.g., as shown in FIG. 12 (an overhead plan view), FIG. 13 (a cross-sectional side view taken along line 13-13 in FIG. 12), and FIG. 14 (a cross-sectional end view taken along line 14-14 in FIG. 12). This volume, generally bounded by first conductive layer 304A, second conductive layer 304B, and vias 314 separated by an appropriate interval V, may define a waveguide 310—that is, in this example, a topographically tubular cuboid conductive structure used to carry electromagnetic waves such as EHF energy.

First conductive layer 304A may include an aperture 320 aligned with waveguide 310 and in communication with waveguide 310. For example, as shown FIGS. 12 and 13, aperture 320 may be a substantially rectangular opening within first conductive layer 304A and having a size corresponding to the cross-sectional size of waveguide 310. As mentioned, waveguide 310 may have an additional open side or end, indicated as opening 318, defined by the configuration of first conductive layer 304A, second conductive layer 304B, and spaced vias 314. Aperture 320 and opening 318 may in effect provide opposite open ends of waveguide 310.

In the embodiment shown, vias 314 may line opposite sides of waveguide 310. For example, as shown in FIG. 12, a first line 324 of regularly spaced vias 314 may define a first side 326 of waveguide 310, and a second line 328 of vias 314 may define a second side 330 of waveguide 310. The two sides 326, 330 thus may define opposite sides of waveguide 310. Conductive components 308 such as vias 314 may also extend along an edge of aperture 320, shown as a third line of vias 332 spaced at intervals V and defining a third side 334 of waveguide 310 opposite opening 318. Third line 332 may form a corner 322 of waveguide 310 adjacent to aperture 320. Aperture 320 may be disposed on a side of waveguide 310 formed by the first conductive layer 304A.

Conductive components 308 optionally may alternatively or additionally include a plurality of intermediate conductive layers 316, seen in FIGS. 13 and 14. Intermediate layers 316 may be disposed between and parallel to first conductive layer 304A and second conductive layer 304B. Each pair of adjacent intermediate layers 316 may be spaced apart by a dielectric layer (e.g. a portion of dielectric layer 306). Each intermediate layer 316 may have an aperture or recess having edges defining waveguide 310. Unlike aperture 320 of first conductive layer 304A (which may be considered an uppermost conductive layer at major face 204), apertures of intermediate layers 316 may extend the entire length of waveguide 310 in this example—that is, from third side 334 of waveguide 310 to opening 318 of waveguide 310. Vias 314 may extend through intermediate layers 316 along the edges of the apertures of intermediate layers 316. For example, vias 314 may extend from first conductive layer 304A to second conductive layer 304B and therefore extend through all intermediate layers 316. Electrically conductive vias 314 accordingly may assure that all conductive layers including first conductive layer 304A, second conductive layer 304B, and intermediate layers 316 if present have the same electrical potential, e.g., a ground potential.

In other examples, a plurality of intermediate conductive layers 316 having recesses conforming with the edges of vias 314 may be used instead of or in addition to vias 314 to define the sides of waveguide 310. The intermediate layers 316 may be coupled to the top and bottom conductive layers, making them intermediate conductive layers. These intermediate conductive layers 316 may be formed with edges forming recesses or openings that define the waveguide sides, as with recesses 218 described in relation to the embodiment of FIG. 7A.

Substrate assembly 302 may further include a first transducer 340 mounted proximate aperture 320 of first conductive layer 304A. Transducer 340 may be or may include an antenna. Substrate assembly 302 may further include an IC package such as a communication circuit 152 or communication device 164 that includes transducer 340, configured to transmit EHF radiation into waveguide 310 through aperture 320. In this example, transducer 340 produces radiation that is polarized parallel to the short sides of aperture 320, and correspondingly to waveguide sides 326 and 330. Additionally or alternatively, transducer 340 may be configured to receive EHF radiation 344 from waveguide 310 through aperture 320. Transducer 340 may be mounted in a spaced relationship relative to major face 312 of substrate assembly 302. For example, transducer 340 may be mounted to, separated from, and/or disposed above major face 312 by an additional dielectric material. The separation or stand-off distance from transducer 340 to aperture 320 may be selected according to the EM characteristics of transducer 340.

This arrangement may result in a portion of radiation 344 transmitted by first transducer 340 being directed into waveguide 310—that is, into the space between conductive layers 304A and 304B and between vias 314, where it may be further directed in the positive X direction toward opening 318. Alternatively or additionally, transducer 340 may receive radiation 344 directed through aperture 320 by waveguide 310.

Substrate assembly 302 may further include a second transducer 342 mounted opposite aperture 320 of first conductive layer 304A and therefore adjacent opening 318. Second transducer 342 may be generally similar to first transducer 340 except adapted to a position proximate opening 318 rather than aperture 320. Transducer 342 accordingly may be or may include an antenna, may be a portion of a communication circuit 152 or device 164, and may be mounted in an IC package. Transducer 342 may be configured to transmit EHF radiation 346 into waveguide 310 through opening 318 and/or receive EHF radiation 346 from waveguide 310 through opening 318. Transducer 342 may be mounted in a spaced relationship relative to opening 318. For example, transducer 342 may be mounted to, separated from, and/or disposed proximate opening 318 by additional dielectric material. The separation or stand-off distance from transducer 342 to opening 318 may be selected according to the EM characteristics of transducer 342.

Second transducer 342 may be selected to be operationally compatible with first transducer 340, e.g., to enable communication from first transducer 340 to second transducer 342 and/or from second transducer 342 to first transducer 340. Although first transducer 340 is generally described as a transmitter and second transducer 342 as a receiver, either transducer may provide either or both functions, e.g., to enable bidirectional communication between first transducer 340 and second transducer 342. It will also be appreciated that other EM structures may be disposed proximate the ends of waveguide 310 to transmit EM radiation, such as, an intervening waveguide or a radiation-directing assembly.

Radiation 344 to/from first transducer 340 may have an expected wavelength. As described, vias 314 may be spaced at intervals V substantially less than one wavelength in order to present a reflective surface for the radiation. Waveguide 310 may have a width dimension W defined as the distance in the Y dimension between conductive components 308 on each side of waveguide 310. Width W may be greater than one half of a wavelength at the lowest frequency in use. For expected dielectric materials and a 60 GHz radiation signal, a preferred minimum width W may be approximately 1.3 mm. Waveguide 310 may have a ratio of width W to height G of 2:1. It is seen that waveguide 310 is configured to conduct an EM EHF signal and in this example includes an elongate length of a dielectric material in dielectric layer 306 forming the waveguide 310 and bounded by a conductive layer 304 covering at least a portion of the length of dielectric material. The elongate length of dielectric material may include a partly enclosed interior volume within dielectric substrate assembly 302 as detailed below. The conductive layer may include, e.g., first conductive layer 304A, which may cover at least a portion of the dielectric material and which may leave another portion (i.e., aperture 320) uncovered, and/or second conductive layer 304B. As shown in FIG. 13, dielectric material 302 may have a rectangular cross section transverse to the length of the dielectric material from dielectric layer 306.

The dielectric material may have a first lateral side 326 and a second lateral side 330 opposed to the first lateral side. These lateral sides may be those electrically defined by conductive vias 314, for example, which may represent EM-opaque sides or surfaces at the frequency at which the waveguide 310 is designed to operate. The length of dielectric material may have first major side (e.g., that defined by first conductive layer 304A) and a second major side (e.g., that defined by conductive layer 304B) opposed to the first major side. The length of dielectric material 302 may have a width, e.g., distance W, corresponding to a distance between the first and second lateral sides. The width may be at least half of a low frequency EHF signal that the waveguide is designed to operate. The length of dielectric material may have a height, e.g., distance G, corresponding to a distance between the first and second major sides.

It will thus be appreciated that locating an antenna or other transducer off-chip may result in effective antenna impedance matching, independent antenna design, increased transmission power, and selective directional shaping of a resulting radiation pattern. The radiation may thus be directed in a direction where a receiving antenna, waveguide, or other EM radiation-directing structure may be positioned. It will also be appreciated that radiation patterns may be selectively and directionally shaped using PCB or other substrate structures, and that the PCB structures may be manufactured using standard manufacturing methods and incorporating standard PCB components, albeit in new and unique ways. It will be further appreciated that shaping the non-conductive dielectric portion of the PCB proximate to the transducer, without the use of conductive layers, whether said transducer is located on-chip or off-chip, can enable directional shaping of the radiation pattern.

Figures that show radiation patterns illustrate idealized and simplified radiation patterns that may result from different configurations, and may not show the actual results of simulations of these configurations. Actual radiation patterns may depend on relative configurations, actual structures, and the strength of applied signals. Distance values such as C, F, O, S, and so on generally may include or consider associated tolerances. "Vertical" may refer to distances or directions substantially perpendicular to the major face of a dielectric assembly, i.e., along a Z-axis such as defined by reference line 192. "Above" or "below" may refer to distances or directions directed respectively toward the positive or negative half of a vertical axis. "Horizontal" and related terms may refer to distances or directions substantially parallel to the major face of a dielectric assembly. These terms are terms of convenience used to describe the structures in the orientations illustrated and are intended to apply regardless of the actual orientations in a given application.

INDUSTRIAL APPLICABILITY

The inventions described herein relate to industrial and commercial industries, such as, electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A device for directing extremely high frequency (EHF) electromagnetic radiation, the device comprising:
   a dielectric substrate assembly comprised of a plurality of conductive layers forming a stair-stepped configuration, including a top conductive layer having a major face, a bottom conductive layer, and a plurality of intermediate conductive layers, the plurality of conductive layers supported in spaced-apart positions by intervening dielectric layers formed in the dielectric substrate assembly, the plurality of intermediate conductive layers each having a major surface with a first perimeter, each first perimeter comprising perimeter portions that are offset relative to each other; and
   an electromagnetic transducer disposed along a plane of the major face of the top conductive layer and positioned at a vertical offset distance from the major face of the top conductive layer, the transducer having an outer edge positioned proximate to a first step formed by one of the plurality of intermediate conductive layers immediately adjacent to the top conductive layer, wherein each conductive layer represents one step, where a tread length of each step is defined by a horizontal distance extending away from the outer edge of the transducer, such that an edge of each of the plurality of intermediate conductive layers extends beyond an edge of the conductive layer immediately above it when viewed from the top conductive layer to the bottom conductive layer.

2. The device of claim 1, wherein a plane transverse to the major surfaces of the plurality of embedded conductive layers intersects the perimeter portions along a curvilinear line.

3. The device of claim 2, wherein the curvilinear line is concave as viewed from the transducer position.

4. The device of claim 1, wherein a line connecting adjacent intersections of the perimeter portions by a plane transverse to the major surfaces of the plurality of embedded conductive layers intersects the perimeter portions along a rectilinear line.

5. The device of claim 1, wherein the intermediate conductive layers are spaced apart at a distance substantially less than an operating wavelength of EHF electromagnetic radiation incident on the dielectric substrate assembly directed to or from the transducer.

6. The device of claim 1, wherein the directing assembly further includes a plurality of conductive vias formed in the dielectric substrate and interconnecting the plurality of intermediate conductive layers.

7. The device of claim 6, wherein the plurality of vias is distributed along the perimeter portions.

8. The device of claim 1, wherein the vertical offset distance is less than a wavelength of the operating frequency of the transducer.

9. The device of claim 1, wherein the transducer is a loop antenna.

10. The device of claim 1, wherein the transducer is a folded dipole antenna.

11. The device of claim 1, wherein the outer edge of the transducer is aligned with an inner-most point of a recess in the top conductive layer corresponding to the first step.

* * * * *